United States Patent [19]

Harari et al.

[11] Patent Number: 5,396,468

[45] Date of Patent: Mar. 7, 1995

[54] STREAMLINED WRITE OPERATION FOR EEPROM SYSTEM

[75] Inventors: Eliyahou Harari, Los Gatos; Daniel C. Guterman, Fremont; Sanjay Mehrotra, Milpitas; Stephen J. Gross, Santa Clara; John S. Mangan, Santa Cruz, all of Calif.

[73] Assignee: SunDisk Corporation, Santa Clara, Calif.

[21] Appl. No.: 148,932

[22] Filed: Nov. 8, 1993

Related U.S. Application Data

[63] Continuation-in-part of Ser. No. 670,246, Mar. 15, 1991, Pat. No. 5,270,979.

[51] Int. Cl.$^6$ ............................................. G11C 7/00
[52] U.S. Cl. ................................. 365/218; 365/185; 365/189.01
[58] Field of Search .................... 365/218, 189.01, 185

[56] References Cited

U.S. PATENT DOCUMENTS

| 4,811,294 | 3/1989 | Kobayashi et al. | 365/218 X |
|---|---|---|---|
| 5,053,990 | 10/1991 | Kreifels et al. | 365/218 X |
| 5,214,605 | 5/1993 | Lim et al. | 365/218 |
| 5,293,560 | 3/1994 | Harari | 365/218 |
| 5,297,095 | 3/1994 | Sato et al. | 365/218 |

FOREIGN PATENT DOCUMENTS 405182478 7/1993 Japan ..................... 365/218

Primary Examiner—Eugene R. LaRoche
Assistant Examiner—Son Dinh
Attorney, Agent, or Firm—Majestic, Parsons, Siebert & Hsue

[57] ABSTRACT

Various optimizing techniques are used for erasing semiconductor electrically erasable programmable read only memories (EEPROM). An erase algorithm accomplishes erasing of a group of memory cells by application of incremental erase pulses. Techniques include a 2-phase verification process interleaving between pulse applications; special handling of a sample of cells within each erasable unit group; defects handling; and adaptive initial erasing voltages. A streamlined write operation on a flash sector of the EEPROM is implemented by employing the optimized erase in an efficient manner. The write operation includes an initial quick erase of the sector followed by programming of data and verification. Only on those infrequent occasions when a failure occurs as manifested during program verification that the optimized erase will need be evoked.

11 Claims, 13 Drawing Sheets

| VEmax | CYCLE COUNT (NO. OF PROGRAM/ERASE CYCLING) |
|---|---|
| 12 | 10 |
| 13 | 30 |
| 14 | 100 |
| 15 | 300 |
| 16 | 1000 |
| 17 | 3,000 |
| 18 | 10,000 |
| 19 | 30,000 |
| 20 | 100,000 |
| 21 | 300,000 |
| 22 | 1,000,000 |

STREAMLINED WRITE OPERATION FOR EEPROM SYSTEM

This is a continuation-in-part application of Ser. No. 07/670,246, filed Mar. 15, 1991, now U.S. Pat. No. 5,270,979.

BACKGROUND OF THE INVENTION

This invention relates generally to semiconductor electrically erasable programmable read only memories (EEPROM) and specifically to techniques for optimum erasing and programming of them.

Computer systems typically use magnetic disk drives for mass storage of data. However, disk drives are disadvantageous in that they are bulky and in their requirement for high precision moving mechanical parts. Consequently, they are not rugged and are prone to reliability problems as well as consuming significant amounts of power. Solid state memory devices such as DRAM's and SRAM's do not suffer from these disadvantages. However, they are much more expensive and require constant power to maintain their memory (volatile). Consequently, they are typically used as temporary storage.

ROM, EEPROM and Flash EEPROM are all non-volatile solid state memories. They retain their memory even after power is shut down. However, ROM and PROM cannot be reprogrammed. UVPROM cannot be erased electrically. On the other hand, EEPROM and Flash EEPROM have the further advantage of being electrically writable (or programmable) and erasable.

Nevertheless, conventional EEPROM and Flash EEPROM have a limited lifetime due to the endurance-related stress the device suffers each time it goes through an erase/program cycle. The endurance of a Flash EEPROM device is its ability to withstand a given number of program/erase cycles. Thus, with use, defects tend to build up in the memory array and typically the devices are rendered unreliable after $10^3$ to $10^4$ write/erase cycles.

It is desirable to have a specific type of semiconductor memory system having non-volatility, ease of erasing and rewriting, speed of access, low cost and reliability.

The program/erase operation cycle is the single most stressful operation on EEPROM. Furthermore, it is also the most time-consuming operation. Traditionally, EEPROM and Flash EEPROM are used in applications where semi-permanent storage of data or program is required but with a limited need for reprogramming.

Optimized erase implementations for EEPROM systems have been disclosed in several copending U.S. patent applications. Copending U.S. patent application, Ser. No. 204,175, filed Jun. 8, 1988, by Dr. Eliyahou Harari, discloses an intelligent erase method for improved endurance. The flash EEPROM cells are erased by applying a pulse of erasing voltage followed by a read operation to verify if the cells are erased to the "erased" state. If not, further pulsing and verifying are repeated until the cells are verified to be erased. By erasing in this controlled manner the cells are not subjected to over-stress or over-erasure. Over-erasure tends to age the EEPROM device prematurely as well as to make the cells harder to re-program. Co-pending U.S. patent application, Ser. No. 337,566, filed Apr. 13, 1989, by Dr. Eliyahou Harari et al., discloses selective-multiple-sector erase, in which any combination of flash sectors may be erased together. Those sectors that have been verified as erased are removed from further pulses of erasing voltage, thereby preventing them from over-erasing.

The various techniques disclosed are generally associated with a set of erase parameters which is optimized for the EEPROM for a given juncture in its history. As the EEPROM is subjected to program/erase cycling through use, the erase parameters tend to deviate from their optimum values.

While the incremental pulsing method helps reduce stress, further improvements are possible to minimize stress without sacrificing performance.

Accordingly, it is a primary object of the present invention to provide techniques for improving the performance of erasing and programming of EEPROM system while minimizing stress and maximizing performance.

It is another object, of the present invention to provide techniques for maintaining optimum erase parameters during the history of the EEPROM program/erase cycling.

SUMMARY OF THE INVENTION

These and additional objects are accomplished by the various aspects of the present invention, either alone or in combination, the primary aspects being briefly summarized as below.

According to one aspect of the invention, several techniques are employed to statistically even out the number of program/erase cycles each cell within a sector can undergo. The main aspect of these techniques is to achieve almost uniform stress conditions for all cells in the sector, independent of the actual data pattern being programmed into the sector. The uniformity of program/erase cycling histories results in the cells' erase characteristics spreading in a well-defined and well behaved fashion. The ability to characterize a distribution of erase characteristics by well-defined statistical parameters such as median and standard deviation is conducive and amenable to an optimized erase algorithm.

In one embodiment, prior to the application of the first erase pulse in the erase algorithm, the sample for each sector, to which verification is initially directed, has all its unprogrammed cells programmed to the "programmed" state. In this way the erase characteristics of all cells in the sample are uniform by virtue of having the same program/erase cycling history. It can be seen that the sample suffers the maximum endurance of program/erase cycling, while on the average the rest of the sector suffers half the endurance. The sample's history is therefore well-defined and is a conservative estimate of the whole sector's.

In another embodiment, a "program/inverse program" scheme is employed to render statistically uniform the cycling histories of all cells in the sector. Two data encoding schemes are either randomly or alternately applied to a sector as it is being cycled to scramble the user data pattern. Generally, each sector has a tag associated with it to keep track of which data encoding scheme is to be used. The first scheme encodes the first logical state and the second logical state of binary data respectively with the "erased" state and the "programmed" state of the memory cell. The second scheme has the representations of the first and second logical states reversed relative to the "programmed" and "erased" states. In this way, even if there is a static user data pattern, all cells of the sector experience substantially similar program/erase histories and associated wear-out via this scrambling. This would eliminate, for all practical purposes, the possibility of user data causing diverse histories among the cells in a sector. With all cells in the sector having uniform program/erase histories, individual cells are not susceptible to strong over-erasure due to cumulative erase operations without intervening programming operations.

According to another aspect of the invention, several techniques are employed to rapidly establishing the optimum erase voltage for the cells in the sector, thereby enabling an efficient erasure without over-erasure.

According to one embodiment, a two-phase erase algorithm is applicable to an array of EEPROM cells that is organized in erasable unit of sectors. All cells in an addressable sector are to be flash-erased and a group of selected sectors are tagged for erasing together. A series of incrementing erase-voltage pulses are applied to the cells of all tagged sectors until the cells therein reach the "erased" state. The series of erase pulses steps from an initial voltage up to a predetermined, maximum allowable final voltage. The range between the two limits is set so that the optimum erase voltage of any typical sectors in the array will lie therein. After each pulse, the cells are read to verify if they have reached the erased state.

The two-phase algorithm is used to speed up the verification process. In Phase I, only a small percentage of cells in the sector is sampled for verification in between pulsing. This enables the erase voltage to quickly step up to the optimum erase voltage for that sector. Phase II is then entered after the small sample has been verified. All cells in the sector are now subjected to the verification process in between pulsing. The algorithm calls for continuing application of erase pulses until all cells in the sector are properly erased. However, prior to that, the pulse application may terminate unconditionally if a maximum allowable number of pulses is first reached or if the erase voltage has incremented to a maximum $V_{limit}$ allowable value.

The erase algorithm includes a defect remapping scheme to handle the situation when a maximum number of pulse applications has been reached or alternatively when the erase voltage has incremented to a maximum allowable value. Any cells in the sector that remain unerased are treated as defective and discarded and remapped by spare ones. However, if the number of defective cells exceeds available spare cells, the whole sector is treated as defective and is discarded and remapped by a spare sector. In this way, the performance of the erase algorithm is not compromised by defective cells. A key element of this aspect of the invention is providing a method to determine when bits in the addressed sector which are still not erased should be discarded versus when continued application of erase pulses is called for.

According to another embodiment of the erase algorithm, a single phase erase algorithm with table lookup is provided. The erase speed is further improved by eliminating the Phase I algorithm. A lookup table of program/erase cycling history or "cycle count" of each sector versus estimated maximum allowable erase voltage (e.g., the median voltage shifted by a number of standard deviations) is generated initially by testing a sample group of sectors. During use of the memory device, the program/erase cycling history or "cycle count" of each sector is kept track of. With these in place, the erase algorithm does not need to enter into Phase I to step up from a worst-case starting voltage for the array to the optimum erase voltage for the sector. Instead, the lookup table provides an estimated maximum allowable erase voltage and starting voltage appropriate for the sector. The pulsing starts with a voltage based on this estimated starting erase voltage and proceeds directly to the Phase II (whole sector) verification procedure.

According to another embodiment of the erase algorithm, a self-generating lookup table is employed in conjunction with a hybrid single and two-phase algorithm. The initial time and expense of generating a lookup table is reduced by building the table as the memory device is being used. When the cycle count of a sector to be erased is less than the highest entry on the table, the estimated maximum allowable erase voltage for that cycle count is obtainable from the table. In that case, only Phase II algorithm need be used to complete the erase operation. However, when the cycle count is the same as the highest cycle count entry in the table, a new entry for the new highest cycle count must be computed and the table updated. The erasing is handled by the two-phase algorithm where the new entry of maximum allowable erase voltage is obtained by the incremented erase voltage at the end of Phase I.

According to another aspect of the invention, an adaptive encoding scheme is employed to handle defective cells. Each sector of the memory array is partitioned into segments, termed encoding blocks. If a defective cell is detected within an encoding block which cannot be erased properly but does program properly, the data to be written is inverted or not, as needed, to force the data written into the defective cell to be the "programmed" state. In this way the data in that cell matches the properly working "programmed" state, as opposed to matching the improperly working "erased" state. Each encoding block has a tag associated with it to keep track of whether or not inversion was used.

According to another aspect of the invention, the "program/inverse program" scheme relies on the absence or presence of an ECC error on the retrieved data to indicate whether the data has been programmed with the first or second data encoding scheme. In the preferred embodiment, during the programming of data into a sector under an assigned data encoding scheme from one of two schemes, an ECC is encoded for at least a portion of the data. When the data is subsequently retrieved, it is retrieved by assuming one of the data encoding schemes. The assumed data encoding scheme is correct if no ECC error or if only a correctable ECC error is detected.

According to another aspect of the invention, a streamlined write operation on a flash sector of the EEPROM is implemented by employing the optimized erase procedure in an efficient manner. The write operation includes an erase of the sector followed by programming. The operation is streamlined in that the initial erase is quickly performed by application of a pulse of initial erase voltage that is typically stored with the sector. The initial erase voltage for the sector has been previously set to optimally erase the sector. No optimized erase procedure nor even erase verification is performed at this stage. Thereafter, data including the initial erase voltage for the sector is programmed into the sector and the sector is verified for proper data. If the sector verifies properly, the write operation is completed. Otherwise, the sector is subjected to the optimized erase procedure. The optimized erase procedure essentially attempts to erase the sector within a range of erase voltages prescribed by the statistical property of the population of sectors in the EEPROM. It also updates the sector's erase voltage for future write operations. After the sector has been verified to erase properly, it is returned for programming of data and verification. On the other hand, when the sector fails to be erased properly within the prescribed range of erase voltages, it is subjected to a defect management process in which failed cells or the whole sector is mapped out and replaced by a replacement sector. The defect managed sector is then returned for programming of data and verification.

This write operation is efficient in that it is anticipated most sectors will be adequately erased by the initial quick erase and be allowed to have data programmed therein. Only on those infrequent occasions when a failure occurs, as manifested during program verification, will the optimized erase procedure need to be invoked.

The write operation of the invention is also advantageous in reducing stress to the EEPROM device to a minimum by allowing each sector to have its own optimum erase level.

Additional objects, features and advantages of the present invention will be understood from the following description of the preferred embodiments, which description should be taken in conjunction with the accompanying drawings.

BRIEF DESCRIPTION OF THE DRAWINGS

FIG. 13b illustrates an example partitioning of the header portion 623 of the sector shown in FIG. 13a;

DETAILED DESCRIPTION OF THE PREFERRED EMBODIMENT

EEPROM cell and array

Figure 1:
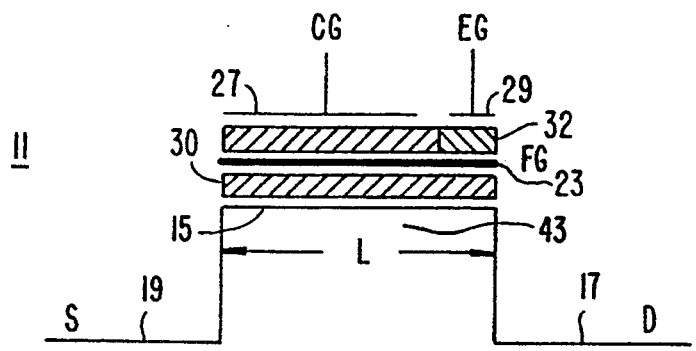
FIG. 1 is a schematic representation of the example EEPROM cell, showing all the cell's gates.

An example EEPROM cell is generally illustrated in the integrated circuit representation of FIG. 1. FIG. 1 shows schematically all the cell's gates, including the drain 17 and source 19. The memory cell 11 contains a floating gate 23, a control gate 27 and an erase gate 29. Heavily n-doped implanted regions 17 and 19, spaced apart along a lightly p-doped substrate 15, serve respectively as a drain and a source for the memory cell 11. A portion of the dielectric 32 between the erase gate and the floating gate has an important bearing on the erase parameters of the memory cell.

The threshold voltage characteristic of the EEPROM cell, as viewed from the control gate 27, is controlled by the amount of charge that is retained on the floating gate 23. The EEPROM cell can be programmed to any threshold level within a threshold window. The size of the threshold window, delimited by the minimum and maximum threshold levels of the device, depends on the device's characteristics, operating conditions and history. Each distinct threshold level within the window may, in principle, be used to designate a definite memory state of the EEPROM cell.

The memory cell 11 is programmed by transferring electrons from the substrate 15 to the floating gate 23. The net electron charge on the floating gate 23 is increased by electrons travelling across the dielectric from a heavily p-doped region 43 and onto the floating gate. Electron charge is removed from the floating gate 23 to the erase gate 29 through the dielectric 32 between them. This example EEPROM structure, and a process for manufacturing it, are described in detail in copending patent application Ser. No. 323,779 of Jack H. Yuan and Eliyahou Harari, filed Mar. 15, 1989, which is expressly incorporated herein by reference.

The various aspects of the present invention are typically applied to an array of Flash EEPROM cells in an integrated circuit chip.

Figure 2:
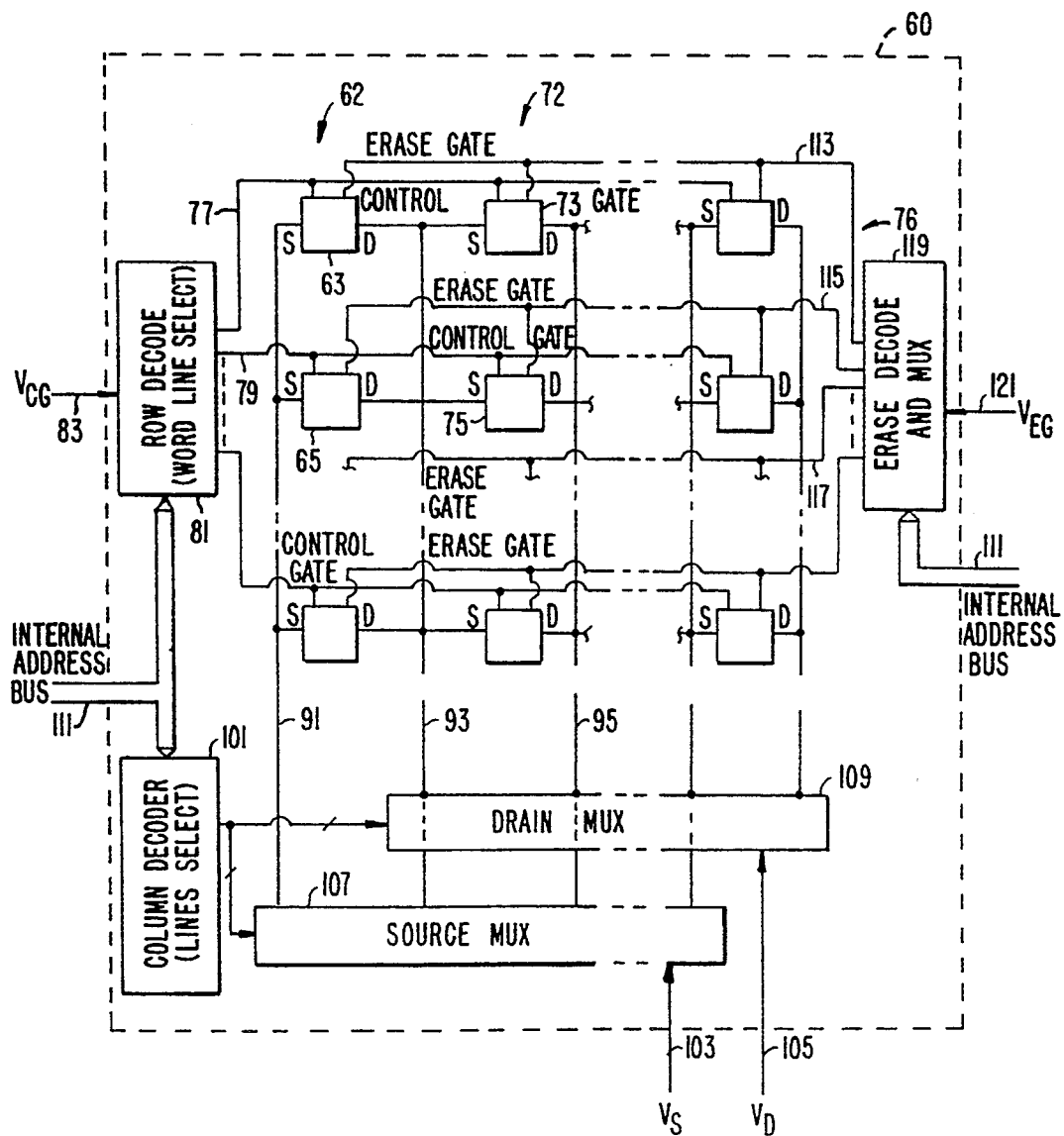
FIG. 2 illustrates schematically an array of individually addressable EEPROM cells.

FIG. 2 illustrates schematically an array of individually addressable EEPROM cells 60. Each cell is equivalent to the one shown in FIG. 1, having a control gate, source and drain, and an erase gate. The plurality of individual memory cells are organized in rows and columns. Each cell is addressed by selectively energizing its row and column simultaneously. A column 62, for example, includes a first memory cell 63, an adjacent second memory cell 65, and so forth. A second column 72 includes memory cells 73, 75, and so forth. Cells 63 and 73 are located in a row 76, cells 65 and 75 in another, adjacent row, and so forth.

Along each row, a word line is connected to all the control gates of the cells in the row. For example, the row 76 has the word line 77 and the next row has the word line 79. A row decoder 81 selectively connects the control gate voltage $V_{CG}$ on an input line 83 to all the control gates along a selected word line for a row.

Along each column, all the cells have their sources connected by a source line such as 91 and all their drains by a drain line such as 93. Since the cells along a row are connected in series by their sources and drains, the drain of one cell is also the source of the adjacent cell. Thus, the line 93 is the drain line for the column 62 as well as the source line for the column 72. A column decoder 101 selectively connects the source voltage. $V_S$ on an input line 103 to all the sources and connects the drain voltage $V_D$ on an input line 105 to all the drains along a selected column.

Each cell is addressed by the row and column in which it is located. For example, if the cell 75 is addressed for programming or reading, appropriate programming or reading voltages must be supplied to the cell's control gate, source and drain. An address on the internal address bus 111 is used to decode row decoder 81 for connecting $V_{CG}$ to the word line 79 connected to the control gate of the cell 75. The same address is used to decode column decoder 101 for connecting $V_S$ to the source line 93 and $V_D$ to the drain line 95, which are respectively connected to the source and drain of the cell 75.

Access to the erase gate of each cell is similar to that of the control gate. In one implementation, an erase line such as 113 or 115 or 117 is connected to the erase gate of each cell in a row. An erase decoder 119 decodes an address on the internal address bus 111 and selectively connects the erase voltage $V_{EG}$ on input line 121 to an erase line. This allows each row of cells to be addressed independently, such as the row 76 being simultaneously (Flash) erased by proper voltages applied to their erase gates through erase line 113. In this case, the Flash cell consists of one row of memory cells. However, other Flash cell's implementations are possible and most applications will provide for simultaneous erasing of many rows of cells at one time.

In the preferred embodiment, the array is partitioned into sectors where all cells within each sector are erasable together. For example, each sector may consist of 4 rows of cells having a total of 512 bytes (i.e., 512×8 cells) available to the user, and an array of 4Mbit cells may have 1024 sectors. Each sector is individually addressable for erase.

Methods and device for multiple sector erase have been disclosed in copending U.S. patent application Ser. No. 337,566, filed Apr. 13, 1989, by Harari et al, relevant portions of which are expressly incorporated herein by reference.

Statistical description of the erase characteristics

As mentioned before, EEPROM and Flash EEPROM have a limited lifetime due to the endurance-related stress and the associated wear the device endures each time it goes through an erase/program cycle. The physical phenomenon limiting the endurance of conventional EEPROM and Flash EEPROM devices is cumulative trapping of electrons (or trap-up) in the active dielectric films of the device.

Referring back to FIG. 1, during programming, electrons are injected from the substrate 15 to the floating gate 23 through a dielectric film 30. Similarly, during erasing, electrons are extracted from the floating gate 23 to the erase gate 29 through the dielectric interface 32. In both cases, some of the electrons are trapped in the dielectric films. The trapped electrons oppose the applied electric field in subsequent program/erase cycles, thereby causing the programmed threshold voltage to shift to a lower (less programmed) value and the erased threshold voltage to shift to a higher (less erased) value. This can be seen in a gradual closure in the threshold voltage "window" between the programmed state and the erase state. Beyond approximately $1 \times 10^4$ program/erase cycles the window closure can become sufficiently severe to cause the reading circuitry to malfunction. If cycling is continued, the device eventually experiences catastrophic failure due to a ruptured dielectric. This typically occurs at greater than $1 \times 10^6$ cycles, and is known as the intrinsic breakdown of the device. Thus, with use, defects tend to build up in the memory array.

A primary erase characteristic of the EEPROM is the tunnel voltage $V_{tun}$. It is the voltage developed between the floating gate 23 and the erase gate 29 in order to effect erasure. This voltage is responsible for tunneling of electrons from the floating gate to the erase gate. $V_{tun}$ is given by the balance of the externally applied potential on the erase gate $V_E$ and the potential at the floating gate. The potential developed at the floating gate is due to the capacitively coupled displacement and physical charge thereon.

Three issues important to optimum erase of EEPROM devices arise from the discussion above. The first issue is the drifting of the erase characteristics due to the cumulative electron trap-up with program/erase cycling of the device. Generally, erase parameters that are optimized for one historic stage of the device will not be so optimized for other stages.

The second issue is the spread of the distribution of erase characteristics at a given time in the device's history. Depending on the data pattern (0,1) programmed into the device, it is inevitable that some cells will not be programmed, even after other cells have been programmed many thousands of times. These unprogrammed cells still undergo erase, together with the programmed cells in the same sector. After several thousand erases without intervening programming, such cells will become severely over-erased. The erase strategy must therefore comprehend the statistical spread of erase characteristics of the distribution of cells at any given time in the device's history. These two issues, if not addressed properly can lead to poorly optimized erase. Furthermore cells which are permitted to become severely over-erased show the following possible adverse consequences:

a) undesirable increase in cell read current;
b) difficulty in reprogramming;
c) premature failure of the cell, e.g., through inducing oxide leakage or rupture, owing to the continued presence of large excess charge on the floating gate of the over-erased cell, and associated higher sustained fields internal to the cell.

An intelligent erase method is required which is both adaptive to the shifting of the erase characteristics and comprehensive to the spreading of the erase characteristics among a random population of cells.

The third issue is the handling of defective cells as they arise during the device's history; i.e., a small number of cells may cease to operate properly after repeated program/erase cycling. Such cells are often referred to as "stuck 0" or "stuck 1" bits, because their state cannot be altered by subsequent programming or erasing operations.

Prior art devices have not addressed these issues satisfactorily. For example, at a given erase voltage, $V_E$, the time required to adequately erase the device can stretch out from one millisecond initially (i.e., in a virgin device) to 10 seconds in a device which has been cycled through $10^4$ cycles. In anticipation of such degradation prior art Flash EEPROM devices specify a sufficiently long erase pulse duration to allow proper erase after $10^4$ cycles. However, this also results in virgin devices being over-erased and therefore being unnecessarily over-stressed.

Copending U.S. patent application, Ser. No. 274,175, filed Jun. 8, 1988, by Dr. Eliyahou Harari, discloses an intelligent erase method for improved endurance. The flash EEPROM cells are erased by applying a series of short, incrementally increasing voltage erasing pulses. The application of each pulse is followed by a read operation to verify if the cells are erased to the "erased" state. If not, further pulsing at an incremented erase voltage and verifying are repeated until the cells are verified to be erased. By erasing in this controlled manner, the cells are not subjected to over-erasure which tends to age the EEPROM device prematurely as well as to make the cells harder to program.

The present invention addresses carefully the three issues mentioned above and provides techniques for further improvement on erasing EEPROM devices. A statistical description of the erase characteristics of cells in an array is expedient.

Figure 3:
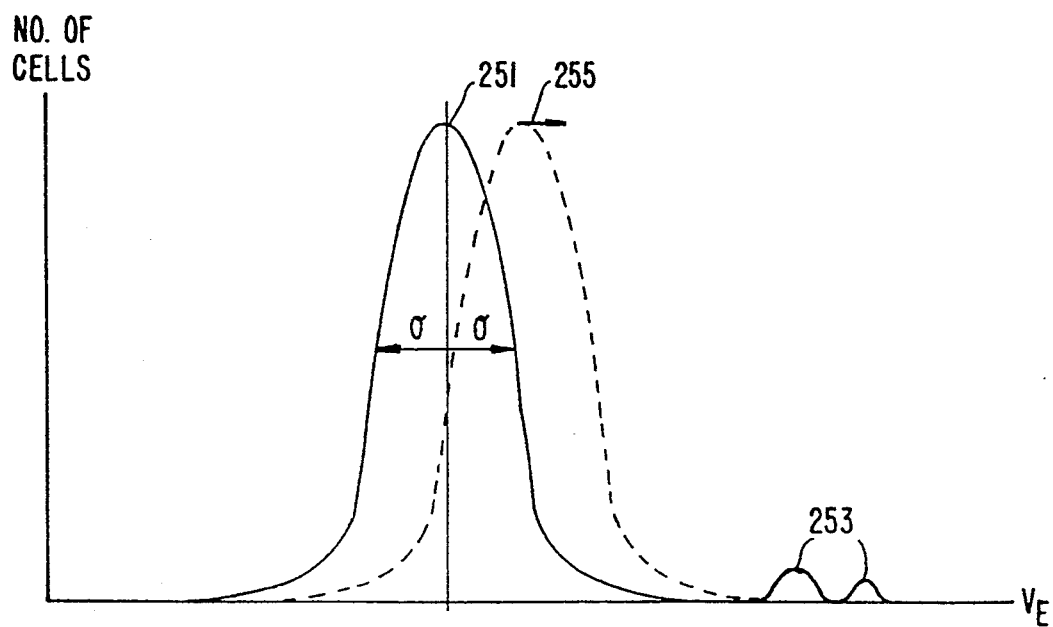
FIG. 3 shows the distribution of erase voltages $VE$ for a group of memory cells or bits.

FIG. 3 shows the distribution of erase voltages $V_E$ denoted by its median 251 for a group of memory cells or bits (e.g. a sector or a group of sectors). This erase voltage distribution is a consequence of the underlying tunnel voltage $V_{tun}$ distribution for the group of cells. Ideally, if each memory cell of the group is identical, the distribution 251 would be tightly confined about a particular erase voltage. In practice, there are cell-to-cell variations due to fabrication, cell location and program/erase cycling history. When each memory cell in the group experiences the same history (program/erase cycling under same conditions for the same number of cycles), the bulk of the distribution is well behaved with members being randomly distributed within a population and following a normal distribution. Thus, except for an errant tail 253 representing a few random, isolated bits, the distribution 251 is essentially a normal distribution with a sufficiently tight standard deviation, $\sigma$ (typically $\sigma$ ranges from 0.3V to 1V).

An efficient erase algorithm can be implemented with knowledge of the median and standard deviation of the population of cells to be erased. For example, with $\sigma \approx 0.3V$, to have all but one bit properly erased in a 4kbit sector requires spanning approximately $\pm 3.3\sigma$ or a spread in erase voltage of approximately $\pm 1V$. If the cells have a median erase voltage of 14V, then an erase voltage of 15V would be required to properly erase all but one bit. Similarly, to have all but one bit properly erased in a 4Mbit array requires approximately $\pm 4.9\sigma$ or approximately $\pm 1.5V$.

With program/erase cycling of an entire population, the distribution of erase voltages shifts in parallel fashion to a distribution centered at higher voltages while maintaining substantially the same $\sigma$. FIG. 3 shows a shifted distribution having a higher median 255. This is due to trap-up of each of the cells' erase element, resulting in a shift to higher voltage of the underlying tunnel voltage distribution of that population. Trap-up is observed to occur approximately linearly with each decade of cycling (i.e. power of ten). The shifting rate or trap-up rate is given as volts per decade of cycling. Typically, the trap-up rate is $\approx 1$ V/decade. Therefore, with the exception of errant tail bits the distribution continues to be well behaved.

The errant bits in the errant tail arise from several mechanisms. One is due to defective cells. The defective cells can appear either in the initial screening after fabrication, or during the use of the device through anomalous trap-up with cumulative program/erase cycling. The initially occurring defective bits can be detected by testing to weed out hard defective cells and to screen out grossly errant bits. The testing can also provide some type of exercise to the virgin distribution, so called "infant mortality screen", designed to precipitate potential defective cells, thereby tightening the distribution. Thereafter, in the mature device, defect related errant bits are due mostly to anomalous trap-up, but these will be relatively rare, isolated occurrences.

The other mechanism for generating an errant tail bit or distribution is by artificial and repeated cycling of a few bits, while leaving the remainder of the population un-cycled or exposed to much fewer cycles. This is quite a common occurrence in that the data pattern stored in a memory device invariably includes high activity addresses as well as addresses with zero or little activity.. These bits are not truly defective, they differ from the main body only by virtue of different cycling history. However they could become indistinguishable (barring intense, detailed analysis) from the truly defective bits. Not only will this artificially cause the appearance of an errant tail, but it will result in large over-erase for the lightly written portion, since all cells in the sectors .are erased together. The large over-erase will result in much higher net positive charge on a cell's floating gate than needed to establish the erased state.

Equalization of program/erase cycling history

One aspect of the invention is directed to the issue of the erase operation encompassing the spread of the erase characteristics without attempting to control the spread among the main cell population. Another aspect of the invention is directed to the issue of controlling the spread of the erase characteristics.

According to the aspect directed to encompassing the spread of the erase characteristics, it is assumed that the cell population has a substantially normal distribution with a relatively insignificant errant tail. Except in the unusual case of persistent irregular data pattern, over sufficiently long use all the cells should have substantially uniform cycling history. Even if there is a certain amount of errant tail, it is assumed that the resultant problem of over-erasure is tolerable.

The basic assumption of a randomly dispersed, well behaved distribution carries down to a smaller than sector population sample, e.g. one chunk of cells within a sector. Therefore one chunk can be used to represent its entire sector with respect to distribution, both its inherent distribution and if cycled properly, its worst case history.

Accordingly, this aspect of the invention is to ensure that all cells of a sample group (e.g. chunk(s)) of a sector to be erased are completely programmed prior to the erase operation. In this way all cells in the sample group undergo identical program/erase cycling history independent of user data.

The sample group of cells of a sector serves as an estimate or projection for the rest of the cells in the sector. According to a preferred scheme for erasing a sector, a pulse of erasing voltage is applied to the whole sector followed by a read operation to verify if the sector is properly erased. If the sector is not, the pulsing and verification operations are repeated. In order to speed up this trial-and-error process, initially, only a small sample group of the sector is examined during the verification operations. The rest of the sector will be examined only after the sample group is properly verified.

Figure 4A:
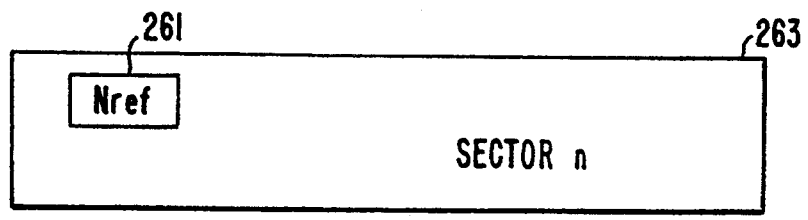
FIG. 4a illustrates schematically a sample group of cells, $N_{ref}$ of a sector.

FIG. 4a illustrates schematically a sample group of cells, $N_{ref}$ 261, of a sector 263. In general, $N_{ref}$ 261 may be assigned from any part of the sector 263. For example, in a 512 byte flash sector, consisting of 4 rows of 1024 cells, there will be 64 chunks of cells, with each chunk consisting of 64 cells. $N_{ref}$ may constitute one chunk of cell. If one chunk is considered insufficient, two or more chunks could be used at the cost of more erase-verify time overhead. To maintain generality the label $N_{ref}$ will be used to designate the reference chunks.

Figure 4B:
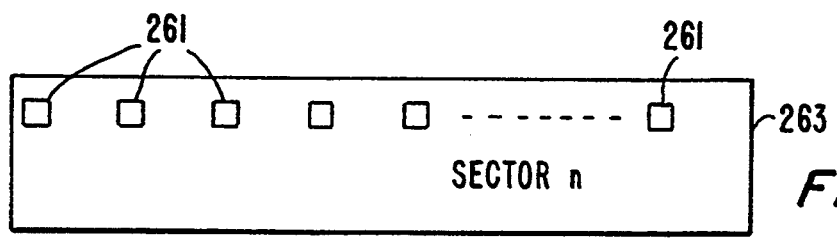
FIG. 4b illustrates the preferred embodiment in which cells of $N_{ref}$ are physically distributed among a sector.

In general, the cells of $N_{ref}$ may be clustered or may be distributed among the sector. FIG. 4b illustrates the preferred embodiment in which the cells of $N_{ref}$ 261 are physically distributed among the sector 263. In this way, the chance of localized phenomena influencing the $N_{ref}$ bits is minimized.

These $N_{ref}$ chunks could be drawn from the main data portion of the sector, without tying up additional dedicated memory space. As soon as the sector has been deactivated and tagged for erase, the $N_{ref}$ chunks area is read, data inverted and written back into the $N_{ref}$ chunks. In this way the $N_{ref}$'s see continuous program/erase cycling, while still being available to the user for data storage.

Figure 5:
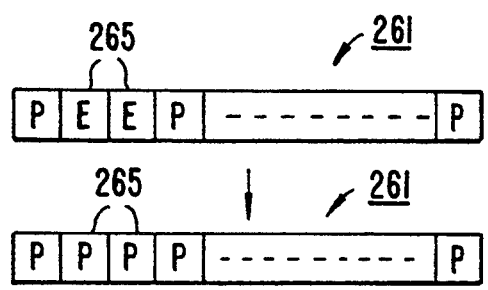
FIG. 5 illustrates the programming of $N_{ref}$ so that all its cells are in the "programmed" state.

FIG. 5 illustrates the programming of $N_{ref}$ 261 so that all its cells are in the "programmed" state. This is performed prior to the first erase and verify operation of the sector 263. Thus, all those cells 265 of $N_{ref}$ that were in the "erased" state are programmed to the "programmed" state. All cells previously programmed remain programmed during this programming operation. By fully programming $N_{ref}$ prior to the erasure of the sector, all cells in $N_{ref}$ are guaranteed to get cycled every program/erase cycle regardless of user data pattern. It can be seen that $N_{ref}$ endures the maximum program/erase cycling rate, while on the average the rest of the sector endures half the maximum program/erase cycling rate. $N_{ref}$ therefore represents a conservative estimate for the rest of the sector. That is, if the cells in $N_{ref}$ are verified to be properly erased, the cells in the rest of the sector are most likely to be so too.

Thus, according to this aspect of the invention, the leveling of cells' cycling histories in $N_{ref}$ is implemented without further leveling for cells in the rest of the sector.

According to another aspect of the invention directed to controlling the spread of the erase characteristics, all cells within a sector are made to undergo statistically similar program/erase cycling histories. This will avoid the likelihood of over-erase for those lightly programmed cells. It also maintains the distribution of erase characteristics within well defined boundary.

The invention calls for levelling of the histories among cells within a sector by means of a "program/inverse program" scheme. For example, in a 2-state cell, the data assumes a pattern of "0"'s and "1"'s. The logical "0" and the "1" states may be represented by the physical "erased" state and the "programmed" state respectively. It is possible to have a data pattern which repeatedly leaves a portion of a sector in "0" state or in this sample the "erased" state while putting another portion in the "1" or "programmed" state. The "program/inverse program" scheme serves to scramble this type of static data pattern.

Figure 6A:
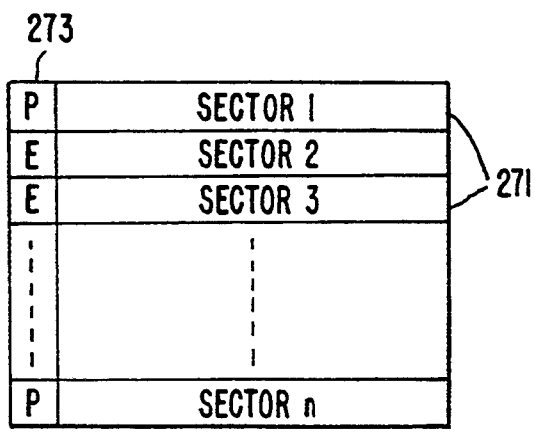
FIG. 6a illustrates a preferred embodiment of the "program/inverse program" scheme.

FIG. 6a illustrates a preferred embodiment: of the "program/inverse program" history levelling scheme. Each sector 271 in the array has an associated sector encoding flag 273. The sector encoding flag is a tag bit which designates which encoding scheme is to be used for encoding the data when programming the sector. For example, the sector with the tag bit set at the "erased" state has data encoded with "0" logical state corresponding to the physical "erased" state, and the "1" state to the "programmed" state. Similarly, the sector with the tag bit set at the "programmed" state has data encoded with "0" logical state corresponding to the physical "programmed" state, and the "1" state to the "erased" state. In other words, the tag bit indicates whether the user data was "programmed" (tag bit in the "erased" state) or "inverse programmed" (tag bit in the "programmed" state) into the sector.

Figure 6B:
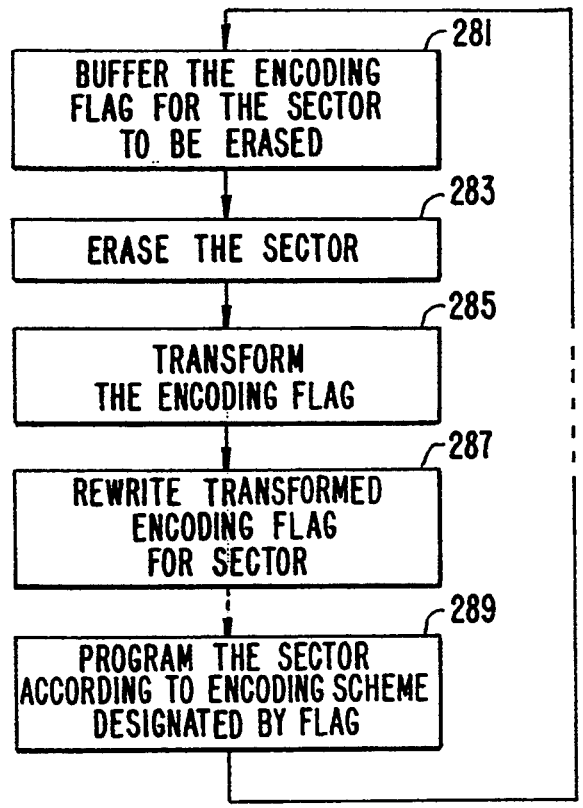
FIG. 6b illustrates the sequence of flipping the parity bit in the "program/inverse program" scheme.

FIG. 6b illustrates the sequence of flipping the sector encoding flag bit. Essentially, prior to each subsequent write operation of the sector 271 (see FIG. 6a), the sector encoding flag bit 273 is flipped, thereby inverting the encoding relation between the logical state and the physical state in a subsequent program operation. In the preferred embodiment, the sector encoding flag is stored as a bit within its associated sector. If a sector is to be erased, its associated sector encoding flag is first saved by being buffered into a temporary memory (step 281). The sector is then erased (step 283). The sector encoding flag is then transformed to a new value (step 285) before being rewritten back to the erased sector (step 287). The transformation of the encoding flag between each program/erase cycle depends on which transform function is being used. In the preferred embodiment, the sector encoding flag simply flips or inverts between the "erased" and the "programmed" states. With each subsequent write to a given sector, the physical to logical state relationship is inverted. Thus, the "0" logical state is alternately represented by the "erased" physical state and the "programmed" state respectively. This would eliminate, for all practical purposes, the possibility of user data causing diverse histories among the cells in a sector. With all cells in the sector having uniform program/erase histories, strong intrasector over-erase is avoided.

The "program/inverse program" histories levelling scheme should be able to scramble most data patterns. However, there is still a remote possibility of user data getting in sync with the flipping, thereby defeating it. In an alternative embodiment, a randomizing component is introduced to the inversion to eliminate this occurrence. This can be implemented by random or pseudo-random transform function for step 285.

After the erased sector has been assigned a new encoding flag, the sector is ready for programming. In a subsequent programming of the sector (step 289), data is programmed or inverse programmed into the sector according to the encoding scheme designated by the encoding flag.

According to one aspect of the invention, the "program/inverse program" scheme is implemented by itself without the levelling of cell histories in $N_{ref}$.

According to another aspect of the invention, the levelling of cell histories in $N_{ref}$ is implemented in conjunction with the "program/inverse program" scheme to also level cell histories in the rest of the sector. As discussed earlier, the $N_{ref}$ chunks are wearing out at twice the rate of the remaining chunks in the same sector. This results in a distribution that will shift towards higher $V_E$ with program/erase cycling, but maintaining substantially the same spread (similar to the distribution 255 of FIG. 3).

Optimized erase algorithm

Figure 7:
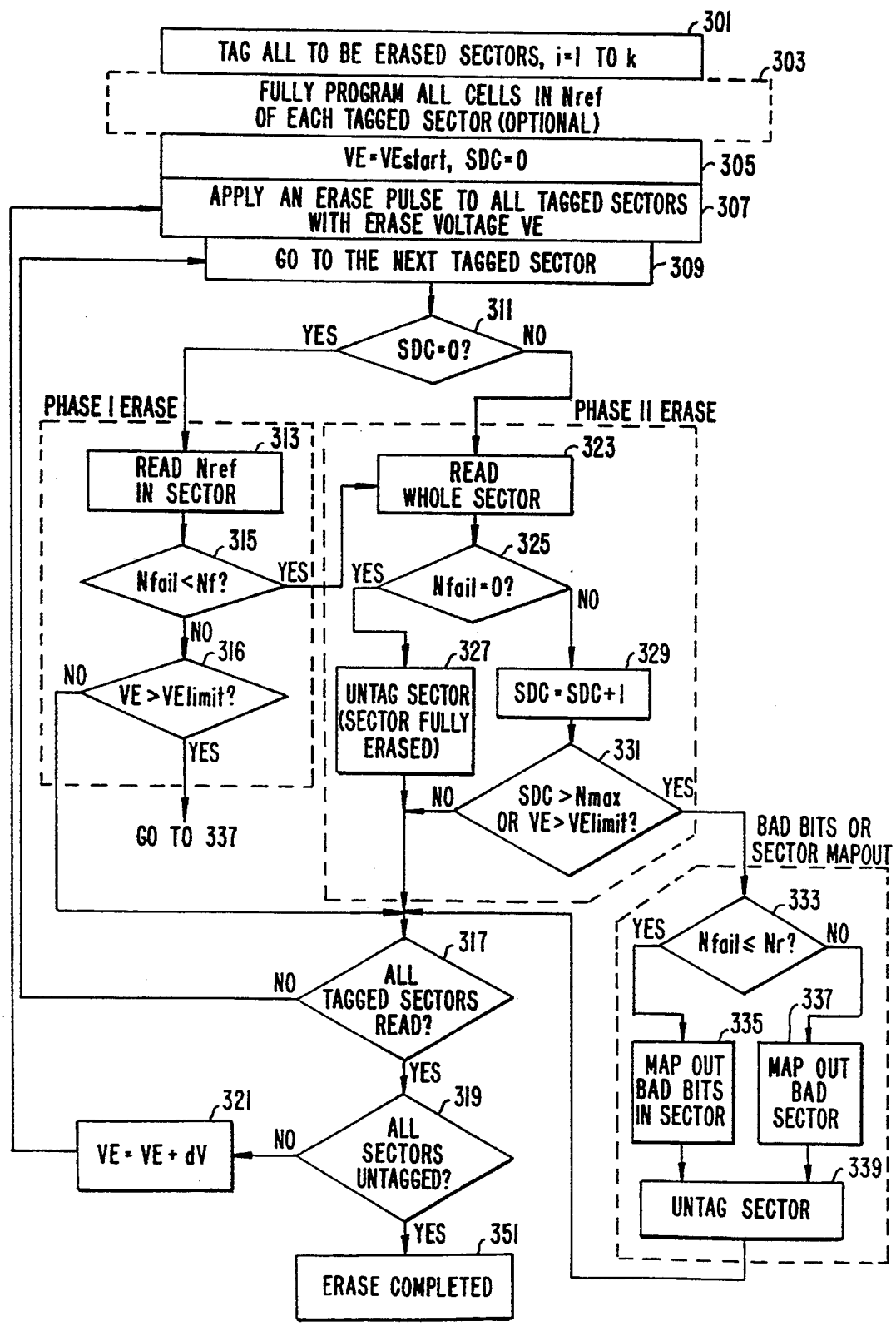
FIG. 7 outlines the main steps in the sequence of an erase algorithm incorporating the various aspects of the invention.

FIG. 7 outlines the main steps in the sequence of a two-phase erase algorithm incorporating the various aspects of the invention discussed above. Assume that an array of EEPROM cells partitioned into flash sectors is to be fully erased. Certain parameters established in conjunction with the erase algorithm are listed as follows:

Vestart is the erase voltage of the first erase pulse. Conventionally, a single pulse of a given erase voltage of about 10 milliseconds duration is used to erase a given virgin device to the erased state. Vestart is lower by perhaps 5 volts from that erase voltage. Typically, Vestart may be between 10 and 20 volts. In the present embodiment, VEstart may be assumed to be 12 volts. In another embodiment, VEstart is adaptive and tracks the final voltages used to properly erase the sectors.

VE is the erase voltage being applied to the erase gates of all the cells in a tagged sector.

dV is the increment of erase voltage level in each successive pulse. A preferred embodiment is to set it to correspond to approximately $1\sigma$.

t is the pulse duration and is chosen to be approximately one-hundredth of the single-pulse time required to fully erase a virgin device. Typically, t may be between 1 and 10 milliseconds. In the present embodiment t is taken to be 0.01 sec.

SDC=0 refers to the Phase I case where only a small sample of the sector, $N_{ref}$ is being examined.

SDC>0 refers to the Phase II case where the whole sector is being examined for erased verification, after $N_{ref}$ has been verified.

$N_{fail}$ is the number of cells that fail to be verified to be in the "erased" state,.

$N_f$ is the maximum number of failed cells tolerable in $N_{ref}$ before proceeding from Phase I to Phase II. A preferred embodiment is to set $N_f$ such that cell population spanning $1\sigma$ beyond the $V_E$ median would pass.

$N_{max}$ is the maximum number of pulsing and verification cycles allowable in the whole sector verifying phase. This number is established by the trade off considerations of number of bits still not erased, i.e. failing, versus the magnitude of over erasure. A preferred embodiment is to set $N_{max}$ such that when reached, VE would be at approximately $3\sigma$ beyond the median for a normal distribution (in the case of $1\sigma/dV$, $N_{max}=3$ steps of dV increment.)

$VE_{final}$ is the maximum or final voltage attained through iteration of the erase algorithm.

$VE_{limit}$ is the maximum limit of voltage allowable for VE. (Typically set by hardware limit.)

$N_r$ is the number of cells available for replacement of the defective cells that fail to properly erase after the whole-sector verification phase has reached the maximum cycles of $N_{max}$.

The sequence for a complete erase cycle of the two-phase erase algorithm is as follows (see FIG. 7):

Step 301: Tag the combination of sectors which are to be erased together. The erase operation will be applied only to the tagged sectors. (As the individual sectors are verified to be erased or have reached some other specified conditions, they are untagged to remove from further erasing.)

Step 303: Maintain the uniformity of program/erase cycling history of cells in the tagged sectors. In the fully-programmed $N_{ref}$ scheme, all erased cells of the $N_{ref}$'s of all tagged sectors are programmed to the "programmed" state.

Step 305: Set $VE=VE_{start}$, and SDC=0 (to initialize the erase operation).

Step 307: Apply an erase pulse of width t, and voltage VE to all tagged sectors.

Step 309: Interrogate each tagged sector one by one.

Step 311: Determine whether the algorithm is in the $N_{ref}$ verification phase (Phase I, SDC=0), or has entered the whole-sector verification phase (Phase II, SDC>0). For SDC=0, the operation proceeds to Step 313. For SDC>0, the operation proceeds to Step 323.

Step 313: The algorithm is in the $N_{ref}$ verification phase (Phase I, SDC=0). Verify the sector at hand by examining only the cells of $N_{ref}$.

Step 315: Determine whether the number of cells that fail the verification, $N_{fail}$ is more or less than a predetermined number $N_f$. If $N_{fail}>N_f$, go to the next step, Step 316. If otherwise, go to Step 323.

Step 316: Set a compare condition of $VE<VE_{limit}$ to prevent the possibility of incrementing VE indefinitely. If "NO" the algorithm proceeds to Step 3117 If "YES" the sector is defective and the algorithm proceeds to Step 337 to map it out as a bad sector.

Step 317: Go back to Step 309 until all tagged sectors are read. When all tagged sectors have been read, go to Step 319.

Step 319: Determine if there are any sectors left untagged. If there are still tagged sectors left, go to Step 321. If all sectors are untagged, the erase operation is completed as operation proceeds to Step 351.

Step 321: Increment VE by dV, and go back to Step 307 to apply the pulsing and verification routine on the remaining tagged sectors.

Step 323: The algorithm is in the whole-sector verification phase (Phase II, SDC>0). Verify the sector at hand by examining all the cells in the sector, and proceed to Step 325.

Step 325: Determine whether all the cells in the sector at hand are verified as erased. If they are ($N_{fail}=0$), then the sector at hand is fully erased, and operation proceeds to Step 327. If one or more cells are still not erased ($N_{fail}>0$), go to Step 329.

Step 327: Untag the sector to remove it from further erasing, and proceed to the next sector via Step 317.

Step 329: Increment SDC by 1. (Essentially, for SDC between 1 and $N_{max}$ the algorithm is in the whole-sector verification phase) Proceed to Step 331.

Step 331: Determine if SDC>$N_{max}$, or if VE>$VE_{limit}$. During the whole-sector verification phase, these conditions place upper limits on the number of pulsing and verification cycles. If neither limit is exceeded, proceed to another cycle through Step 317. If either one of the limits is reached, the sector at hand is not erased further. The remaining cells or bits that fail to verify are handled by a defect mapout routine beginning from Step 333.

Step 333: Determine if the number of remaining cells or bits that fail to verify, $N_{fail}$ is replaceable. (i.e. if $N_{fail} \leq N_r$.) If replaceable, proceed to Step 335. If not, proceed to Step 337.

Step 335: The bad bits are replaceable ($N_{fail}<N_r$). Map out the remaining bad bits in the sector at hand, and replace with spare bits. Proceed to Step 339.

Step 337: The bad bits exceed the available replaceable bits ($N_{fail}>N_r$). Retire the sector at hand by marking it as bad. Proceed to Step 339.

Step 339: Untag the bad-bits mapped out sector or the marked-as-bad sector so that it is not subject to further erasing. Proceed to Step 317 for other tagged sectors.

Step 351: All sectors are untagged, and the erase operation is completed.

Defects handling during erase

In the preferred embodiment, the erase algorithm incorporates defect management to handle the situation when a number of cells fail to erase completely after a predetermined number of pulses, as given by Steps 333 to 339. Bad or marginal bits are to be detected and replaced. This is advantageous because the presence of bad bit can drag out the erase operation, thereby compromising performance. Furthermore, it leads to the problem of over-erase for the bulk of the cell population, thereby reducing reliability.

In the preferred embodiment, once a bit is retired it is never resurrected (i.e. can't be brought back into the pool of available/good bits, even if subsequently it starts to pass again as for example during a future erase operation to its sector.) Also, once a determination is made during an erase session by the erase algorithm that the number of bits failing to erase is greater than the replaceable number ($N_{fail}>N_r$), then the sector is retired, unconditionally, even if higher erase voltages could have made them pass. This rule is based on the following considerations. First, the maximum voltage that will be allowed to be supplied to the sector, dictated by appropriate use of $N_{ref}$, should be more than enough to encompass not only the entire spread of normally distributed bits in that sector (i.e. covering $\approx +3.3\sigma$) but covering some fraction of errant tail as well. With repeated cycling, any tail that pops up beyond that distribution ceiling is a consequence of very marginal, unreliable bits, a relatively rare event, and those bits should be retired. If the number of these tail bits, $N_{fail}$, exceeds $N_r$ (the replaceable ceiling), then the cost of retiring the sector is small, being a rare event. On the other hand, it is risky to save the sector at any cost, by raising the erase voltage beyond the value dictated by the main body population ($N_{ref}$). It introduces both the risk of using marginal bits and the risk associated with over-erase to the entire main body of population, thereby causing unreliable operation of the memory device. In the preferred embodiment, in order to avoid the potential risks, and to be consistent with the strategy of avoiding strong over-erase, there are no last desperate attempts to save errant bits or to salvage marginal sectors by continued increase in erase voltage VE.

Adaptive Starting Erase Voltage, VEstart

In the two-phase erase algorithm, the cycling history and erase voltage required for the main body distribution of each sector is estimated from its $N_{ref}$. Therefore, other than for tracking or archiving purposes, the erase voltage or history of the sector need not be saved since it is not required by the erase algorithm. Thus, for example, the erase voltage VE can start with a nominal $VE_{start}=12V$ and leave it to the phase I part of the algorithm to step up to the appropriate median erase voltage for a given sector.

Figure 8A:
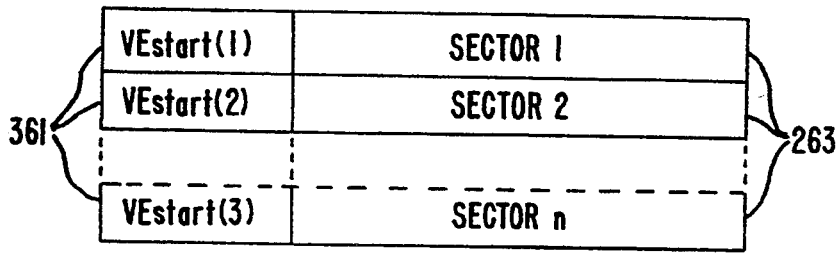
FIG. 8a illustrates a more efficient embodiment which allows the $VE_{start}$ for each sector to be stored.

FIG. 8a illustrates a more efficient embodiment which allows the $VE_{start}$ 361 for each sector 263 to be stored. The optimum $VE_{start}$ is adaptively optimized for a sector during its program/erase cycling history. As mentioned earlier, the erase characteristics tend to shift with program/erase cycling. The optimum $VE_{start}$ therefore tends to shift to a higher voltage with increasing cycling. In one embodiment, as soon as cells of $N_{ref}$ for a sector are properly verified (according to the condition, $N_{fail}<N_f$ as in Step 315 in FIG. 7), i.e. the condition required to proceed to Phase II, the VE value at that stage is stored as the updated $VE_{start}$ 361 for that sector. In a subsequent erase of the sector, the optimum $VE_{start}$ is based on this updated $VE_{start}$ 361 (e.g. optimum $VE_{start}$=updated $VE_{start}$—a constant). In this way, the optimum starting erase parameter is maintained throughout the history of the device.

Figure 8B:
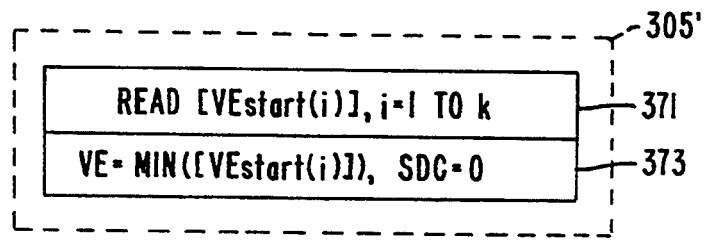
FIG. 8b illustrates the modification to the two-phase erase algorithm of FIG. 7 to accommodate adaptive $VE_{start}$.

FIG. 8b illustrates the modification to the two-phase erase algorithm of FIG. 7 to accommodate adaptive $VE_{start}$. The original step 305 is replaced by 305' which comprises Steps 371 and 373. In the case of a multiplicity of sectors being erased, the associated updated $VE_{start}$'s 361 for the sectors are read (Step 371), and the optimum $VE_{start}$ for the multiple sectors is given by the minimum of the associated updated $VE_{start}$'s (Step 373).

The two-phase erase algorithm is applicable to the memory array having sectors with varying degree of program/erase cycling histories, and therefore varying optimum erase voltages. The optimum erase voltage of each sector can be defined relative to the median and standard deviation of the statistical distribution appropriate for each sector's cycling history. The erase algorithm implements the erase operation by erase pulses increasing from a $VE_{start}$ up to a $VE_{final}$. For an array, the sectors therein therefore contains a range of different optimum $VE_{start}$'s and $VE_{final}$'s. The lowest $VE_{start}$ corresponds to that of the least cycled and the highest $VE_{final}$ corresponds to that of the most cycled sectors among the array.

In order to comprehend all sectors with different cycling histories in the array, the erase algorithm employs a "worst-case" value for $VE_{start}$, which is the starting voltage pulse for all sectors in the array. Thus, $VE_{start}$ would correspond to the median (or one shifted by a number of standard deviations) erase voltage of a typical virgin sector. As for $VE_{final}$, the optimum value for each sector is approached through the iteration of Phase I of the erase algorithm. In this way, throughout the intended endurance life history of a sector in the array, its optimum erase voltage would be comprehended within the two limits, $VE_{start}$ and $VE_{final}$. If a sector's optimum erase voltage is inadequate to fully erase all bits, it is handled by the "Bad Bit or Sector Mapout" scheme.

Given the relatively wide range between $VE_{start}$ and $VE_{final}$, one of the problems during erase of a sector is to quickly step up from $VE_{start}$ to the appropriate erase voltage of that sector. As described earlier, phase I of the two-phase algorithm enables the appropriate erase voltage for a given sector to be rapidly located and applied without prior knowledge of the program/erase cycling history of the sector.

According to another embodiment of the erase algorithm, only a single phase (Phase II) is employed. $VE_{final}$ is established not by Phase I algorithm, but by a $VE_{max}$ associated with each sector. This $VE_{max}$ is obtained from a lookup table. In this scheme, a lookup table is first generated and it provides a statistical table of number of program/erase cycling versus $VE_{max}$. $VE_{max}$ is obtained essentially from shifting the median erase voltage by a number of standard deviations. The corresponding $VE_{start}$ is set to a predetermined voltage below $VE_{max}$. In this way, the range between $VE_{start}$ and $VE_{max}$ is tightly localized for the sector under erasure. However, unlike the two-phase scheme, the single phase scheme also needs to keep track of the program/erase cycling history of each sector in the array. When erasing a sector, its history is read and used by the lookup table to obtain the appropriate $VE_{max}$ and $VE_{start}$. In this way, the algorithm can begin directly with the appropriate $VE_{start}$ for the sector instead of using a "worst-case" value, and set a $VE_{max}$ directly without the use of Phase I of the two-phase algorithm. Elimination of phase I further improves the erase efficiency.

Figures 9A, 9B:
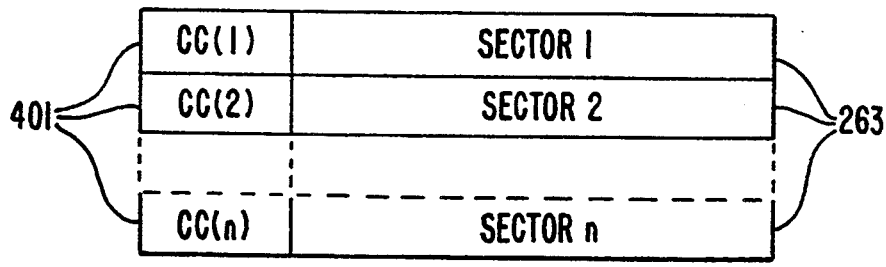
FIG. 9a illustrates schematically a "cycle count" (number of program/erase cycle) being associated with each sector, according to another aspect of the erase algorithm invention.
FIG. 9b is a sample lookup table for $VE_{max}$ relative to the cycle count.

FIG. 9a illustrates schematically the program-erase cycling history of each sector 263 that is kept track of by a "cycle count" 401. The cycle count 401 for a sector indicates the number of program-erase cycles this sector has undergone. Each time a sector undergoes an additional program/erase cycle, its associated cycle count is incremented by one.

FIG. 9b illustrates an example lookup table essentially provides statistics of the median erase of cycle count verses $VE_{max}$. The lookup table 411 voltage (typically shifted by a predetermined number of standard deviations) of a typical sector with a given cycling history. The lookup table 411 is generated prior to the use of the memory device. It is typically generated at the factory by cycling and testing a sample group of sectors. The lookup table 411 can be stored directly into the memory array, e.g., in the sectors used to generate the values.

Figure 10:
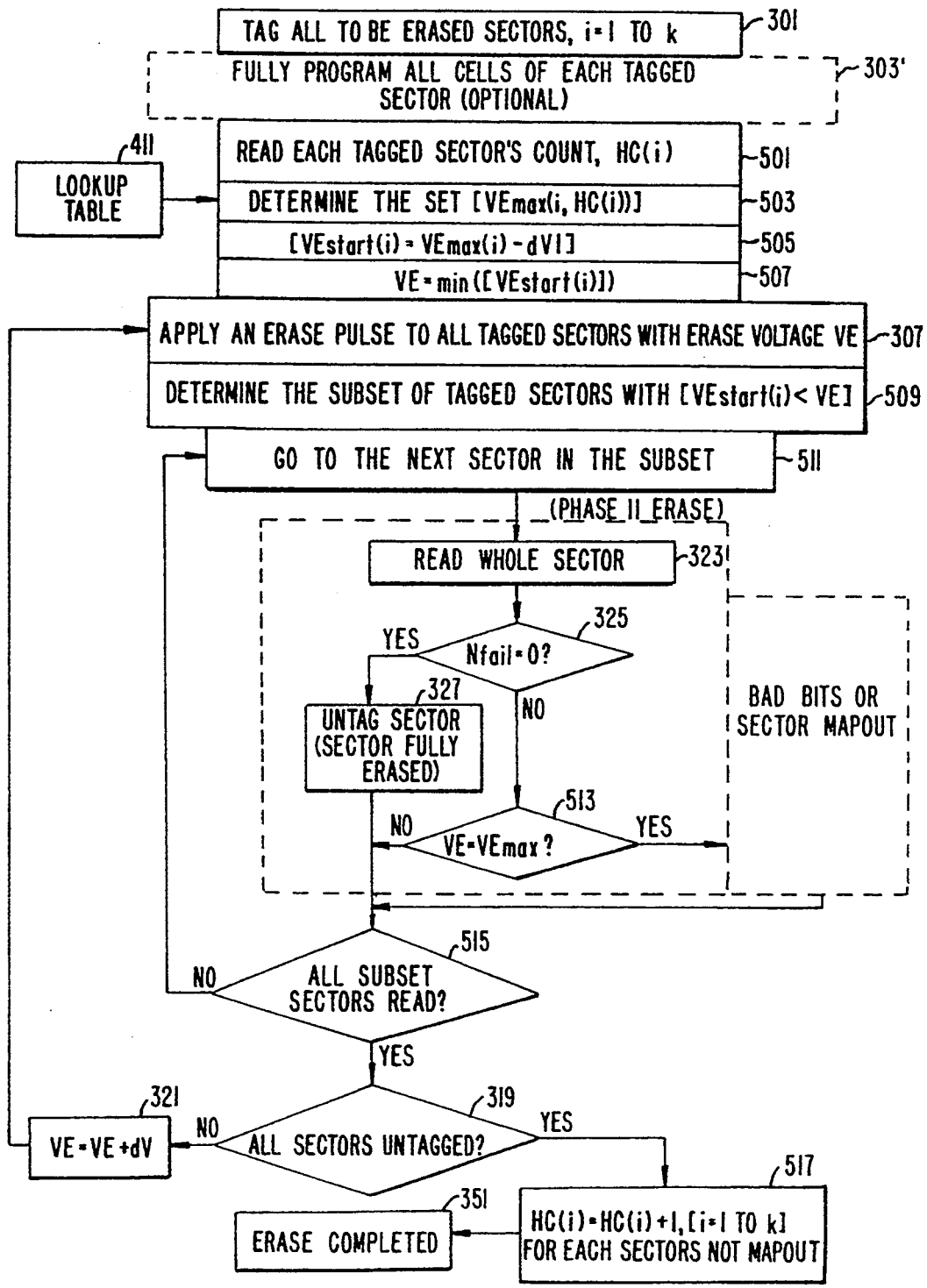
FIG. 10 is illustrates another aspect of the erase algorithm employing a lookup table to optimally set $VE_{start}$ and $VE_{max}$.

FIG. 10 is a flow chart outlining the steps for erasing a cluster of sectors with the single-phase, lookup table scheme. Certain parameters established in conjunction with the erase algorithm are listed as follows:

$i=1,k$ labels the individual sectors among a cluster thereof which are tagged for erasure.

$CC(i)$ is the cycle count (or no. of program/erase cycles undergone) of the ith sector.

$VE_{max}(i)$ is the maximum erase voltage allowed for the ith sector. It is obtained from the lookup table 411.

$VE_{start}$; (i) is the starting erase voltage for the ith sector. In the preferred embodiment, it is given by $VE_{max}$ minus a predetermined voltage $dV1$.

$dV1$ is the voltage stepped down from $VE_{max}$ to get to $VE_{start}$. A preferred embodiment is to set $dV1$ to range from one to two $VE$ is the erase voltage being applied to the erase gates of all the cells in a tagged sector.

$dV$ is the increment of erase voltage level in each successive pulse.

$N_{fail}$ is the number of cells that fail to be verified to be in the "erased" state.

The sequence for a complete erase cycle of the single-phase erase algorithm is as follows (see FIG. 10):

Step 301: Tag the cluster of sectors which are to be erased together. The erase operation will be applied only to the tagged sectors. (As the individual sectors are verified to be erased or have reached some other specified conditions, they are untagged thereby removing them from further erasing.)

Step 303: Maintain the uniformity of program/erase cycling history of cells in the tagged sectors. In one embodiment, all erased cells of the tagged sectors are programmed to the "programmed" state.

Step 501: For each tagged sector $i=1$ to k, read its cycle count $CC(i)$.

Step 503: Using the lookup table 411, determine the corresponding $VE_{max}(i)$ for each tagged sector.

Step 505: In the preferred embodiment, $VE_{start}(i)=VE_{max}(i)-dV1$.

Step 507: Take the lowest $VE_{start}(i)$ value among the cluster as the starting erase voltage for pulsing all tagged sectors.

Step 307: Apply an erase pulse of width t, and voltage $VE$ to all tagged sectors.

Step 509: Verify only the sectors in the cluster most likely to pass. These sectors form a subset where the current erase voltage VE is greater than their $VE_{start}(i)$. The rest of the sectors with higher $VE_{start}(i)$ are unlikely to be erased at the current VE, and therefore time can be saved by ignoring them at the current iteration.

Step 511: Interrogate each tagged sector in the subset one by one.

Step 323: The algorithm is in the whole-sector verification phase (Phase II). Verify the sector at hand by examining all the cells in the sector, and proceed to Step 325.

Step 325: Determine whether all the cells in the sector at hand are verified as erased. If they are ($N_{fail}=0$), then the sector at hand is fully erased, and operation proceeds to Step 327. If one or more cells are still not erased ($N_{fail}>0$), go to Step 513.

Step 327: Untag the sector to remove it from further erasing, and proceed to the next sector in the subset via Step 515.

Step 513: Determine if $VE>VE_{max}$. During the whole-sector verification phase, this condition places an upper limit on the number of pulsing and verification cycles. If the limit is not exceeded, proceed to another cycle through Step 515. If the limit is exceeded, erasing stops and the sector at hand deemed defective. The remaining cells or bits that fail to verify are handled by a defect mapout routine such as that described in Steps 333–339 of FIG. 7.

Step 515: Go back to Step 511 for verification of other sectors in the subset if not all sectors in the subset are read. If all tagged sectors in the subset are read, go to Step 319.

Step 319: Determine if there are any sectors left tagged. If there are still tagged sectors left, go to Step 321 for further pulsing. If all sectors are untagged, the erase operation is completed as operation proceeds to Step 351 via Step 517.

Step 321: Increment VE by dV, and go back to Step 307 to apply the pulsing and verification routine on the remaining tagged sectors.

Step 517: After a sector has been through an erase operation and has not been found defective, its cycle count 401 (see FIG. 9a) is incremented by one.

Step 351: All sectors are untagged, and the erase operation is completed.

According to another embodiment of the erase algorithm, instead of generating the complete lookup table prior to use of the memory, the lookup table is built up gradually as the memory device is being program/erase cycled. This avoids the time and expense of initially generating a lookup table.

Figure 11:
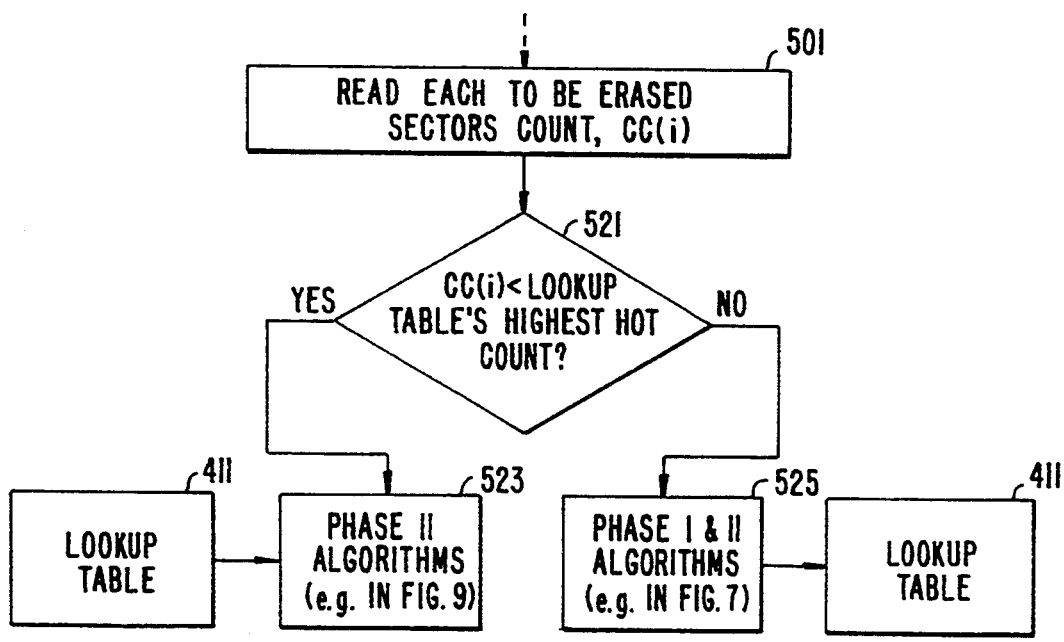
FIG. 11 illustrates an alternative embodiment of the erase algorithm employing a lookup table in which the lookup table is being built during use of the memory device.

FIG. 11 illustrates schematically a hybrid erase algorithm in which both the phase II only algorithm 523 and the two-phase algorithm 525 are employed. When a sector is to be erased, its cycle count is read as in step 501. This cycle count is matched against that in the lookup table. If the cycle count is less than the lookup table's highest cycle count entry, as in step 521, only Phase II algorithm 523 is employed with $VE_{max}(i)$ and $VE_{start}(i)$ provided by the lookup table 411. On the other hand, if the cycle count of the sector prior to erasing is already equal to the lookup table's highest count, $VE_{max}$ for the next cycle count must be estimated. The estimated $VE_{max}$ is obtained by applying the two-phase algorithm 525 and is based on the erase voltage reached at the end of Phase I. The lookup table is then updated in one of two manners depending on the valued of the estimated $VE_{max}$ obtained. If the estimated $VE_{max}$ is less than or equal to the $VE_{max}$ of the lookup table's highest count, no new record will be added to the lookup table, only the highest count in the existing record will be incremented by one. On the other hand, if the estimated $VE_{max}$ is greater than the $VE_{max}$ of the lookup table's highest count, a new record containing the estimated $VE_{max}$ and the highest count incremented by one will be added to the lookup table. In this way, the memory array builds up its own table during normal use and avoids using a two-phase algorithm when possible.

The success of the lookup table schemes depends on the accuracy and integrity of the table. Safe guards such as traps and constraints in the validation of the table entries can easily be implement by persons skilled in the art.

Defects handling by Adaptive Data Encoding Scheme

Generally, defective cells are rare except towards the latter part of an EEPROM device's endurance cycling life history. The defect managing scheme described above, allows defective cells which cannot be properly erased to be detected and mapped with new spare cells, specially reserved for that purpose. For the greater part of the device's life history when the number of these defective cells is not excessive, a simpler and more efficient defect managing scheme can first be employed before relying on the defect mapping scheme.

There are two frequent kinds of defects due to wear out failures in programmable and erasable memories. As an example for the purpose of illustration, the "0" and "1" states are represented respectively by the "erased" and "programmed" state. The "stuck-at-1" defect occurs when the cell is physically stuck at the "programmed" state. It is the more prevalent type of defect where an individual cell, after repeated erase/program cycling, cannot: be properly erased to a "erased" state. The "stuck-at-0" defect occurs when the cell is physically stuck at the "erased" state and cannot be properly programmed. The "stuck-at-0" defects are generally much less prevalent.

According to this aspect of the invention, each sector of the memory array is partitioned into encoding blocks. If a defective cell which cannot be erased properly (i.e. cell is "stuck-at-1") is detected within an encoding block, a data encoding scheme is chosen for that encoding block such that the data to be written to that cell corresponds to a "programmed" or "1" state. In other words, the data to be written is either programmed or inverse programmed, so as to match the data to be written into the "stuck-at-1" cell to the "1" state.

This method is particularly well-suited for block-oriented memories such as flash EEPROM, EPROM or EEPROM, but can be applied to other memory types as well. In flash EEPROM memories, prior to programming a block of data, the corresponding block of cells must all first be erased to the "erased" state before any programming of the "programmed" states.

The present invention is particularly effective against the "stuck-at-1" type of defects. In the new scheme, data is written in 8, 16, 32 or 64 (or other) increment of data, and a spare bit of data is provided for each such increment (e.g., 9th bit added for 8 bits of data or 17th bit added to 16 bits of data, etc.).

The "stuck-at-0" type of defect can also be handled in similar fashion for typical memory devices. However, for Flash devices where a sector of cells are first erased simultaneously before any programming takes place, a two-pass operation is required to implement the inverse programming. That is, upon the detection of a "stuck-at-0" defect during programming operation in a sector, the whole sector must first be erased again before inverse programming can begin.

Figure 12A:
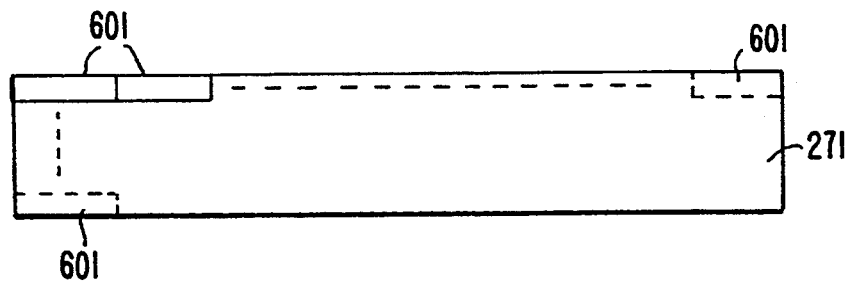
FIG. 12a illustrates schematically a sector partitioned into encoding blocks, according to another aspect of the invention.
Figure 12B:
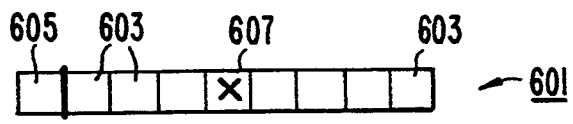
FIG. 12b illustrates schematically an example encoding block having 8 cells for data and an extra cell for storing the "block encoding flag" bit.

FIG. 12a illustrates schematically a sector 271 partitioned into encoding blocks such as 601. FIG. 12b illustrates schematically an example encoding block having 8 cells such as 603 for storing data, and an extra cell 605 for storing the "block encoding flag" bit.

During programming of new data, the address to be written to (which was previously block erased) is first read. If any one bit was not properly erased (such as a cell 607), its specific address is compared with the corresponding bit in the data to be written into that address. If the data for that bit is intended to be a "programmed" state, the data is written as is, and the cell 605 for the "block encoding flag" is left as "erased." If data for that bit is intended to be an "erased" state, the entire data is first inverted, then written into the address and the cell 605 for the "encoding flag" is programmed to a "programmed" state (invert data indicator). In this way the data is made to always match the bad bit, rather than the normal method of identifying defective bits and either replacing them with redundant bits or using ECC to correct for their presence.

This new method is also capable of handling a defect in the cell 605 for the "block encoding flag" itself. This bit is always read prior to writing, and if it reads "programmed" when it should be reading "erased", then the data (which must not have a defect in this case) is inverted.

While the adaptive data encoding scheme can also be applied to the "stuck-at-0" defects, it will not be as efficient in a programming operation. This is because the defective cells which cannot be programmed properly are not detected until after the programming. Thus, the defects can be handled in a two-pass operation where the programmed block would be required to be erased again prior to applying this adaptive data encoding scheme. To deal with bits which are "stuck-at-0" by bits which will properly program, it is necessary to use one or more of the following, such as a two-pass operation, a defect mapping scheme, a redundancy scheme, a defect pointer scheme, or ECC.

When the adaptive data encoding scheme is used in conjunction with the "program/inverse program" histories levelling scheme, any sector containing defective cells will have its sector encoding flag set to a default value to avoid conflict with the block encoding flags.

This new method is very efficient for handling a high density of erase-related bit random errors, e.g., for a total random distribution of erase defects, one extra bit for 16 bits of data can correct for one bad bit in 17 bits. This compares with ECC, which requires about 6 bits of data to correct for one bad bit in 16 bits.

Alternative Embodiments for the "Program/inverse program" history levelling scheme As described earlier in connection with FIGS. 4a, 4b, 5, 6a, and 6b, a "program/inverse program" scheme is employed to render statistically uniform the program-erase cycling histories of all sectors in the EEPROM array. Two data encoding schemes are either randomly or alternately applied to a sector as it is being cycled to scramble the user data pattern. FIG. 6a shows one embodiment in which each sector has a tag associated with it to keep track of which data encoding scheme is to be used. The first scheme encodes the first and second logical states of binary data respectively with the "erased" and the "programmed" states of the memory cell. The second scheme has the representations of the first and second logical states reversed relative to the "programmed" and "erased" states. Whenever a sector is read, its tag indicates which encoding scheme was used in programming the sector and therefore enables the read data to be decoded appropriately.

FIGS. 13a, 13b, 14a, and 14b illustrate alternative embodiments in which a dedicated tag for each sector is not used in identifying the encoding scheme used therein. Instead, when data from a sector is read, an error correction code (ECC) normally associated with the read data will indicate whether the decoding scheme used is correct. If not, the alternative decoding scheme is used. This has the advantage of employing existing resources and avoiding the need to maintain a flag for each sector. Also, the possibility of the flag itself introducing another degree of error is avoided. In the preferred embodiment, the EEPROM controller rapidly arrives at the proper decision by testing in each sector to be read a small field therein and its associated ECC. In practice, one of the header fields of each sector with an associated ECC is expediently employed.

Figure 13A:
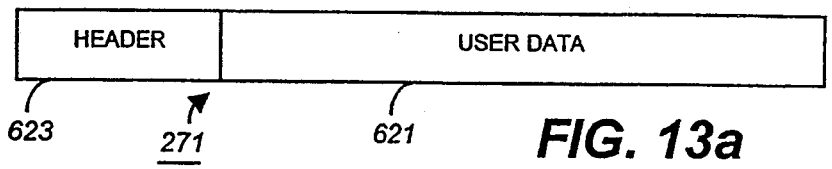
FIG. 13a illustrates the format of a flash sector for an EEPROM device of the present invention.

FIG. 13a illustrates the format of a sector for an EEPROM device of the present invention. The sector 271 has a user data portion 621 for storing user data and a header portion 623 for storing system information related to the sector. Examples of system information are sector identification label; erase parameters such as initial erase voltage, erase duration and/or program/erase cycle count for the sector; defect mapping information; and error correction codes.

Figure 13B:
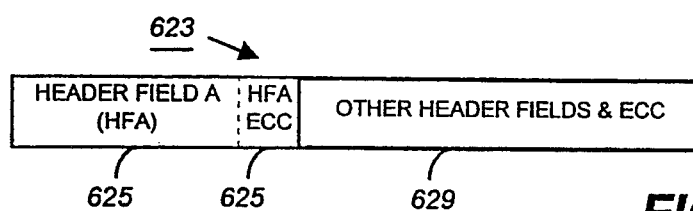

FIG. 13b illustrates an example partitioning of the header portion 623 of the sector shown in FIG. 13a. The header 623 contains a plurality of fields, each related to some aspect of the system information. The example shows a partitioning into a Header Field A (HFA) 625 with an associated HFA ECC 627 and other header fields and associated ECC 629. When HFA 625 is programmed into the header portion of the sector, its associated HFA ECC 627 is computed and stored with it in the header.

Figure 14A:
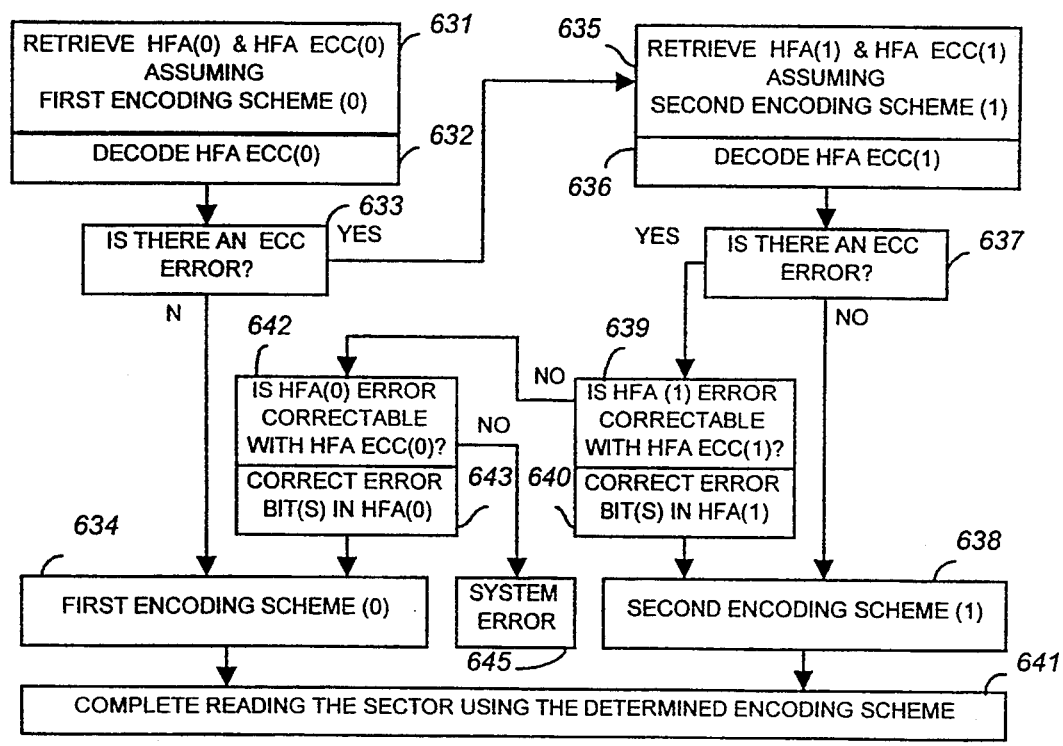
FIG. 14a illustrates a preferred embodiment in which the encoding employed in the "program/inverse program" scheme is identified by the absence or presence of an ECC error.

FIG. 14a illustrates a preferred scheme in which the encoding or decoding scheme is identified by the absence or presence of an ECC error. Use of a small field relative to the entire sector such as HFA 625 plus its associated ECC 627, is preferable since it will allow the controller to perform a quick read. Given a constant number of ECC bits, a smaller field is also more conducive to error correction since the ratio of its associated ECC bits relative to the field bits is higher. The sequence for determining the correct encoding scheme used is as follows:

Step 631: Retrieve the HFA data assuming the first encoding scheme designated by "(0)", e.g., the logical states "0" and "1" correspond to the "erased" and "programmed" states of the EEPROM cell, respectively. The retrieved data is designated by HFA(0) plus HFA ECC(0).

Step 632: In the usual implementation, the HFA data is retrieved via an ECC decoding hardware which will indicate any ECC error after retrieval.

Step 633: Determine if there is an ECC error. If there is, proceed to Step 635. If there is no ECC error go to Step 634.

Step 634: The sector's encoding scheme is identified to be the first encoding scheme (0). Proceed to Step 641.

Step 635: Retrieve the HFA data assuming the second encoding scheme designated by "(1)", e.g., the logical states "0" and "1" respectively correspond to the "programmed" and "erased" state of the EEPROM cell. The retrieved data is designated by HFA(1) plus HFA ECC(1).

Step 636: The HFA data is retrieved via the decoding ECC hardware.

Step 637: Determine if there is an ECC error. If there is no ECC error go to Step 638. If there is, proceed to Step 639.

Step 639: Determine if error correction of HFA(1) by ECC(1) is possible. If it is possible, proceed to Step 640. If it is not possible, proceed to Step 642.

Step 640: Correct the error bit(s), and proceed to Step 638.

Step 638: The sector's encoding scheme is identified to be the second encoding scheme (1). Proceed to Step 641.

Step 641: Complete reading the sector using the determined encoding scheme.

Step 642: Determine if error correction of HFA(0) by ECC(0) is possible. If it is possible, proceed to Step 643. If it is not possible, proceed to Step 645.

Step 643: Correct the error bit(s), and proceed to Step 634.

Step 645: A system error has occurred that cannot be corrected by ECC. Depending on specific implementation, other defect management actions may be taken by the EEPROM controller.

Figure 14B:
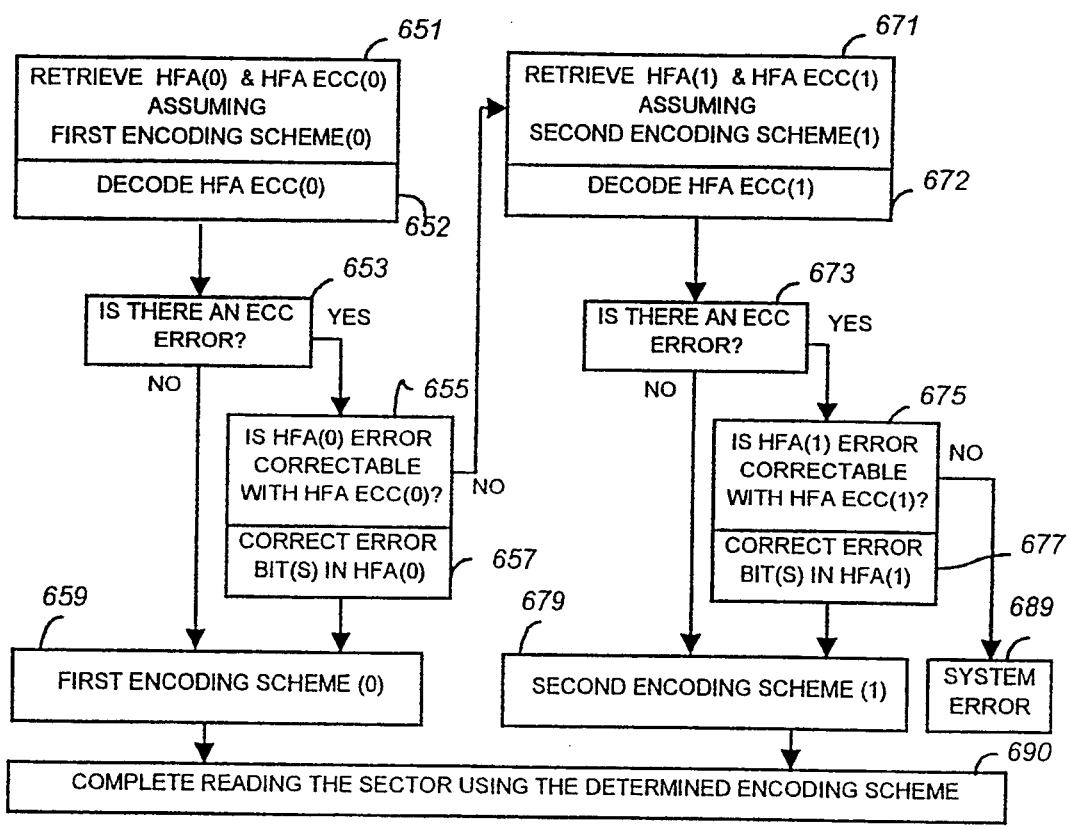
FIG. 14b illustrates another embodiment in which the encoding employed in the "program/inverse program" scheme is identified by the absence or presence of an ECC error.

FIG. 14b illustrates a another embodiment in which the encoding or decoding scheme is identified by the absence or presence of an ECC error. The sequence for determining the correct encoding scheme used is as follows:

Step 651: Retrieve the HFA data assuming the first encoding scheme, e.g., the logical states "0" and "1" respectively correspond to the "erased" and "programmed" states of the EEPROM cell. The retrieved data is designated by HFA(0) plus HFA ECC(0).

Step 652: In the usual implementation, the HFA data is retrieved via an ECC decoding hardware which will indicate any ECC error after retrieval.

Step 653: Determine if there is an ECC error. If there is, proceed to Step 655. If there is no ECC error go to Step 659.

Step 659: The sector's encoding scheme is identified to be the first encoding scheme (0). Proceed to Step 690.

Step 655: Determine if error correction of HFA(0) by ECC(0) is possible. If it is possible, proceed to Step 657. If it is not possible, proceed to Step 671.

Step 657: Correct the error bit(s), and proceed to Step 659.

Step 671: Retrieve the HFA data assuming the second encoding scheme designated by "(1)", e.g., the logical states "0" and "1" respectively correspond to the "programmed" and "erased" state of the EEPROM cell. The retrieved data is designated by HFA(1) plus HFA ECC(1).

Step 672: The HFA data is retrieved via the decoding ECC hardware.

Step 673: Determine if there is an ECC error. If the=re is no ECC error go to Step 679. If there is, proceed to Step 675.

Step 675: Determine if error correction of HFA(1) by ECC(1) is possible. If it is possible, proceed to Step 677. If it is not possible, proceed to Step 689.

Step 677: Correct the error bit(s), and proceed to Step 679.

Step 679: The sector's encoding scheme is identified to be the second encoding scheme (1). Proceed to Step 690.

Step 689: A system error has occurred that cannot be corrected by ECC. Depending on specific implementation, other defect management actions may be taken by the EEPROM controller.

Step 690: Complete reading the sector using the determined encoding scheme.

Other embodiments and variations employing ECC to determine the encoding scheme are possible. Each specific implementation offers speed advantages or simplicity depending on specific system hardware.

Write Operation Incorporating An Optimized Erase Algorithm

Figure 15A:
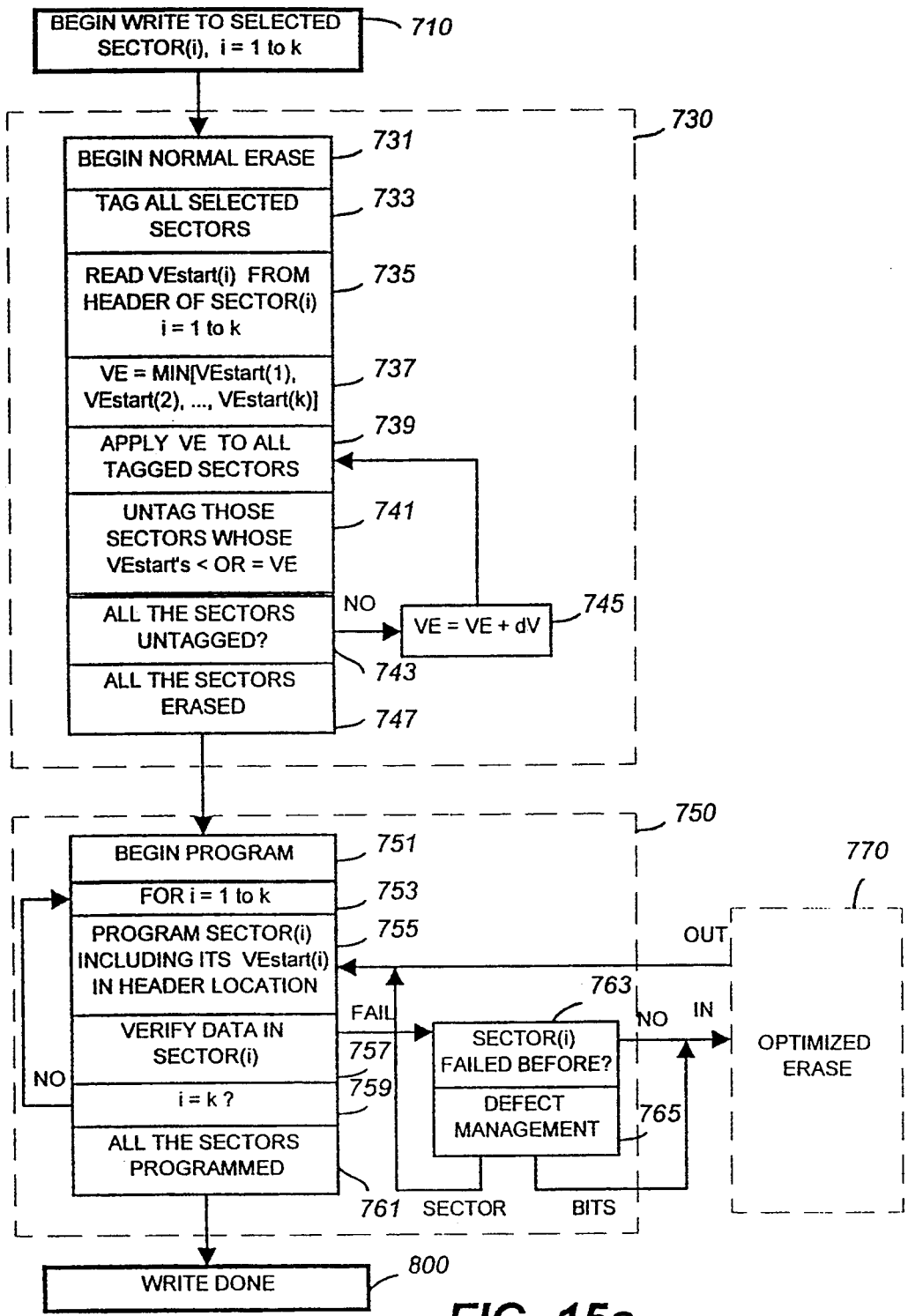
FIG. 15a outlines the main steps in the sequence of a write operation to one or more selected sectors of a flash EEPROM system, according to another aspect of the invention.
Figure 15B:
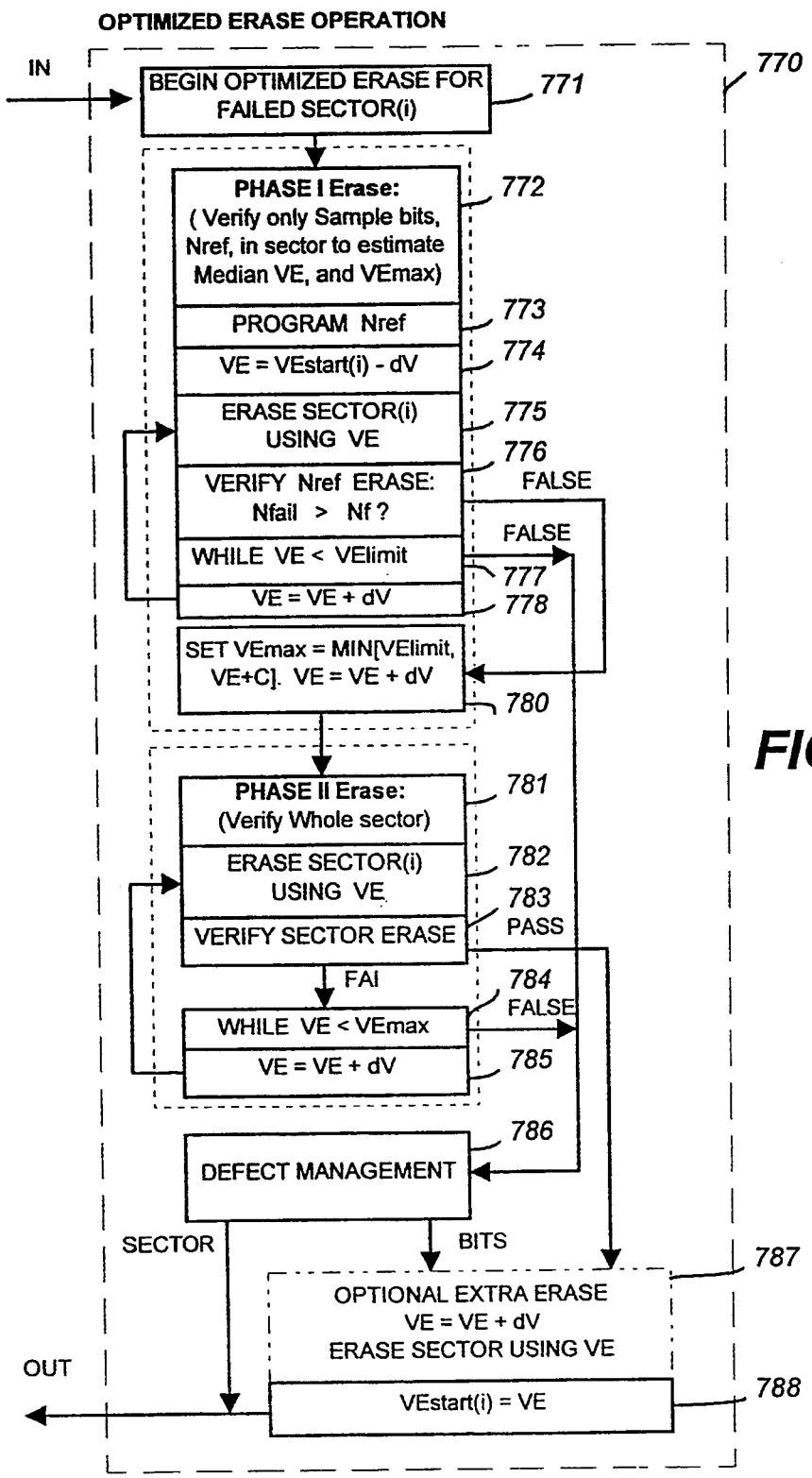
FIG. 15b outlines the sequence of steps for the optimized erase algorithm.

FIG. 15a outlines the main steps in the sequence of a write operation to one or more selected sectors of a flash EEPROM system, according to another aspect of the invention. The write operation includes a normal erase operation 730 followed by a program operation 750 on the selected sectors. The main feature is that the normal erase operation is performed quickly without erase verification or the use of the optimized erase described in connection with FIG. 7. After the normal erase, the selected sectors are then programmed. Each programmed sector is then verified as to proper data. If one or more bits in a programmed sector fail, the sector is subjected to an optimized erase operation similar to that in connection with FIG. 7. If the sector fails to be fixed by the optimized erase operation, it is also subjected to a defect management operation such as 765, 786, or 790 (shown respectively in FIGS. 15a, 15b, and 15c.) After the sector has been treated with the optimized erase operation and/or defect management operation, the treated sector is returned for reprogramming. The write operation is completed when all the selected sectors have been properly programmed.

The parameters established in conjunction with the write operation including optimized erase are the same as those listed earlier in connection with FIG. 7. There are two additional new parameters used in FIG. 15b in the optimized erase operation. One parameter is C, a predetermined voltage spread from the median erase voltage. It corresponds to a predetermined number of standard deviations in the VE population. For example, it may be about 3 volts, corresponding to 5 standard deviations (assuming a standard deviation of 0.6V) for a given flash EEPROM system. The other parameter is $VE_{max}$, the maximum usable erase voltage for the sector as determined by the optimized erase operation, beyond which defect management will be invoked.

The sequence for a complete write cycle, including the normal erase operation 730, the program operation 750 which incorporates the optimized erase 770 and defect management 790 is as follows (see FIG. 15a, FIG. 15b, and FIG. 15c):

OPERATION 710: BEGIN WRITE OPERATION

Begin write to selected sector(i), where i=1 to k, k is the total number of selected sectors. The write operation includes a normal erase operation 730 followed by a program operation 750. In the event of a sector failing to write properly, the program operation branches out to an optimized erase operation 770 and/or defect management 765. When all the selected sectors are properly programmed, the write operation is completed in step 800.

OPERATION 730: NORMAL ERASE OPERATION

Step 731: Begin normal erase. Essentially each selected sector is erased by erase voltage pulses not exceeding its $VE_{start}$ stored in the header thereof. Several embodiments are possible. In the preferred embodiment, all the sectors to be erased are tagged and one or more pulses of the erase voltage VE is applied to them. In between pulses, the erased voltage, VE, is incremented by a predetermined amount, prior to which, those selected sectors with $VE_{start}$ VE are untagged and excluded from further exposure to VE.

Step 733: Tag the combination of sectors, sector(i), i = 1 to k, which are to be erased together.

Step 735: For each sector, read the header including its corresponding $VE_{start}(i)$.

Step 737: Set the erase voltage VE to be the smallest of the $VE_{start}(i)$'s.

Step 739: Apply a pulse of erase voltage VE to all tagged sectors.

Step 741: Untag those sectors whose $VE_{start} \leq$ the current erase voltage VE.

Step 743: As long as there is a sector still tagged, the operation proceeds to step 745. Otherwise, exit to Step 747.

Step 745: Increment VE by dV and return to Step 739.

Step 747: All selected sectors have completed the normal erase operation.

After each of the selected sectors have been erased without verification, the sequence passes to the program operation 750.

OPERATION 750: PROGRAM OPERATION

Step 751: Begin program operation.

Steps 753, 755:

For each of the selected sectors, i=1 to k, program each sector with intended data as well as its header including its corresponding $VE_{start}$.

Step 757: Verify the sector for proper data. If one or more bits in the sector fail to verify, the sequence is passed onto the optimized erase operation 770 or defect management 765 via step 763.

Step 759: If the entire sector has verified properly, and not all selected sectors have been programmed, the sequence returns to step 753, 755 and 757 for programming and verification of the remaining selected sector(s).

Step 761: When all the selected sectors have completed programming, the write operation terminates at Step 800.

Step 800: The write operation is completed.

BRANCHING TO OPTIMIZED ERASE OPERATION 770 or DEFECT MANAGEMENT 765:

In Step 757, when a sector fails to verify properly, the program operation branches out to Step 763.

Step 763: Determine whether the failed sector has branched out before during the present write operation. If this is the first time the sector has branched out, the sector is subjected to the optimized erase operation 770. If the same sector branches out a second time, it has already been treated by the optimized erase operation and resubmitting it thereto will no longer be effective. Instead, the failed sector is subjected to the defect management operation 765. In the event when the failed sector is replaced by a spare sector, then it must enter Step 755, whereupon should it branch out from Step 757 into Step 763, it would be regarded to be branching out for the first time, and the replaced sector will proceed directly to the optimized erase operation 770.

DEFECT MANAGEMENT OPERATION

Step 765: The operation evokes the defect management routine illustrated in FIG. 15c. It essentially maps out the failed bits and replaces them with spare bits in the sector. The defect treated sector is then subjected to the optimized erase 770 before it is returned for reprogramming. However, when the number of failed bits exceeds the available spare bits in the sector, the whole sector is mapped out and replaced by a spare sector. The replaced sector is then returned to step 755 for reprogramming.

Figure 15C:
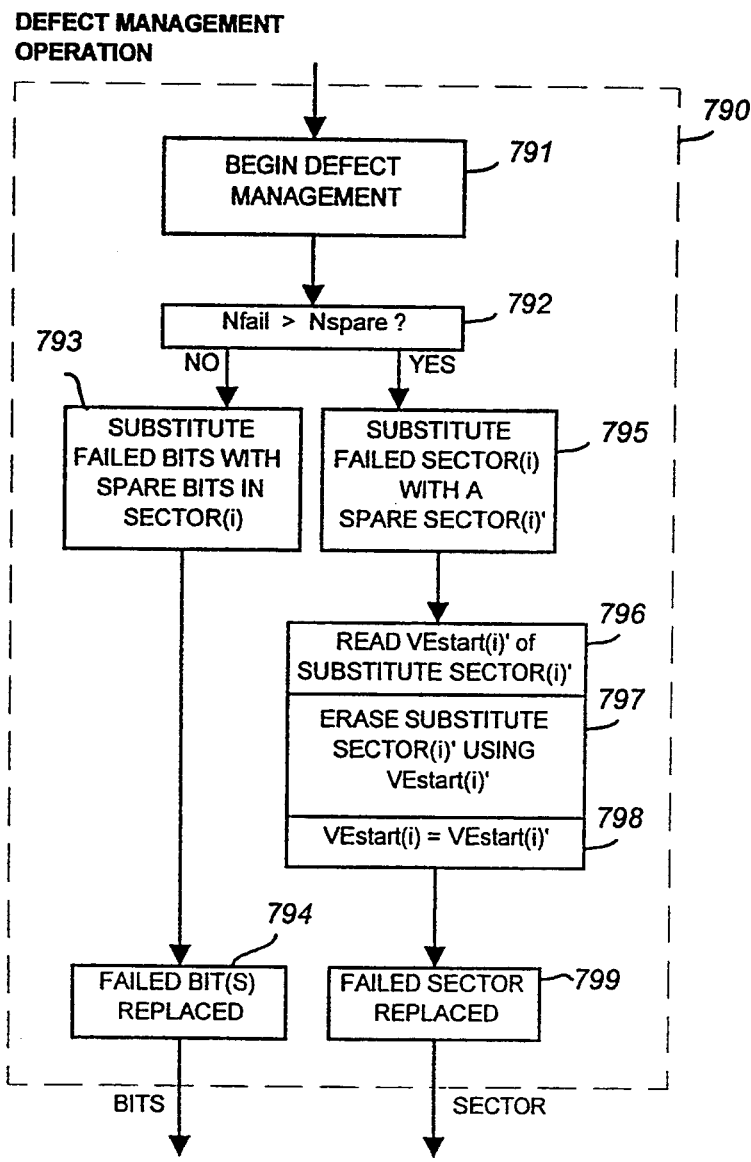
FIG. 15c outlines in more detail the sequence of steps for the defect management operation shown in FIG. 15a and FIG. 15b.

FIG. 15c illustrates the defect management routine 790 in more detail.

Step 791: Begin defect management.

Step 792: Determine whether or not there are enough spare bits in the sector to replace the failed bits. If all the failed bits can be replaced, the sequence proceeds to step 793. If there are insufficient spare bits, the sequence proceeds to step 795 in which the whole sector is replaced.

Step 793: The failed bits are mapped out and replaced by spare bits in the sector.

Step 794: The failed sector has been fixed by having its failed bits replaced.

Step 795: In the event that there are not enough spare bits to replace failed bits, the sequence proceeds from step 792 to step 795. The failed sector is mapped out and replaced with a spare sector from the EEPROM array.

Step 796: The replaced sector needs to be reinitiated by having it erased followed by its header including $VE_{start}$ being reprogrammed later in Step 755. This is started off by reading the header of the substitute sector including its $VE_{start}$.

Step 797: Erase substitute sector using the above $VE_{start}$ as the erase voltage.

Step 798: Set $VE_{start} = VE_{start}(i')$ of the substitute sector.

Step 799: The failed sector has been fixed by being replaced with a substitute sector.

OPERATION 770: OPTIMIZED ERASE OPERATION (illustrated in FIG. 15b.)

Step 771: Begin optimized erase for the failed sector.

Step 772: Begin PHASE I erase. This phase, as before, only verifies sample bits, Nref, in the sector to estimate the median VE, thereby establishing the maximum allowed erase voltage $VE_{max}$.

Step 773: Program the sample bits, Nref, to the "programmed" state.

Step 774: Set erase voltage, VE, by reducing the starting erase voltage, $VE_{start}$, by dV.

Step 775: Erase the sector using VE.

Step 776: Examine the sample cells in $N_{ref}$, and determine whether the number of cells that fail the verification, $N_{failed}$, is more or less than the predetermined number $N_f$. If $N_{failed} > N_f$, go to step 777, otherwise, go to step 780.

Step 777: Determine whether the erase voltage has exceeded a predetermined erase voltage limit $VE_{limit}$. If not exceeded, the sequence proceeds to 778 for further increment of VE. If VE has incremented beyond VE limit, the optimized erased operation is abandoned and the sequence proceeds to step 786 for defect management.

Step 778: Increment VE by dV, and return to step 775 to apply the pulsing and verification routines 775, 776.

Step 780: Before proceeding to PHASE II erase, the maximum erase voltage, $VE_{max}$, is set to be the smaller of $VE_{limit}$ and [VE+C], and VE is incremented by dV.

Step 781: The algorithm is in the PHASE II erase phase which is characterized by verifying the entire sector.

Step 782: Erase the sector using VE.

Step 783: Determine whether all the cells in the sector are verified as erase. If they are ($N_{fail}=0$), then the sector is fully erased, and the sequence proceeds to Step 787. If one or more cells are still not erased ($N_{fail}>0$), go to Step 784.

Step 784: Determine if $VE \geqq VE_{max}$. If not true, proceed to Step 785. On the other hand, if the limit is reached, the sector is not erased further. The remaining cells or bits that fail to verify are handled by the defect management routine beginning from Step 786.

Step 785: Increment VE by dV and return to Step 782 to apply the pulsing and verification routines 782, 783 on the sector.

Step 786: Defect management is the same as that shown in more detail in FIG. 15c. The failing sector will either have its bad bits replaced or the whole sector replaced. After the sector has its failed bits replaced, the sequence proceeds to Step 787. On the other hand, if the failed sector is replaced, the sequence exits from the optimized erase operation 770 and enters the program operation via Step 755 for reprogramming of a newly replaced sector.

Step 787: Provide an optional extra erase pulse to have the sector erased with an extra margin. This includes incrementing the erase voltage VE by dV before erasing the sector with it.

Step 788: Reset $VE_{start}$ to the current value of VE. The sequence then exits from the optimized erase operation 770 and enters the program operation via Step 755 for reprogramming of a failed sector that has been treated by the optimized erase operation.

While the embodiments of this invention that have been described are the preferred implementations, those skilled in the art will understand that variation thereof may also be possible. Therefore, the invention is entitled to protection within the full scope of the appended claims.

It is claimed:

1. For an array of electrically erasable and programmable read only memory cells having means for addressing the cells to program, read and erase their states, each cell having a transistor that includes a floating gate and an erase electrode, and having a natural threshold voltage that is alterable by programming or erasing to a level of charge on the floating gate to obtain an effective threshold voltage, wherein said natural threshold voltage corresponds to that when the floating gate has a level of charge equal to zero, said array being partitioned into sectors of memory cells, each sector being addressable for simultaneous erasing of all cells therein, a method of erasing a sector of addressed cells of the array followed by programming data thereto, comprising the steps of:

reading a set of erase parameters stored in said sector and corresponding thereto;

erasing said sector by employing said set of erase parameters;

programming data including said set of erase parameters into said sector;

verifying the programmed data; and if the verifying fails, subjecting said sector to an optimized erase comprising:

in a first phase, pulsing said sector with an erase voltage incremented successively from a value derived from said set of erase parameters and verifying a sample of cells of said sector in between pulses until more than a predetermined number of cells in said sector are completely erased; and thereafter in a second phase, continuing pulsing said sector with an erase voltage incremented from the last pulsing step and verifying all cells therein in between pulses until they are completely erased; and repeating the steps of programming and verifying until the verifying passes.

2. The method as in claim 1, wherein said set of erase parameters includes an initial erase voltage, and said step of erasing said sector employing said set of erase parameters includes erasing said sector with a pulse of erase voltage substantially equal to the initial erase voltage.

3. The method as in claim 2, wherein the steps of pulsing and verifying in the first or second phases terminate whenever the erase voltage has incremented beyond a predetermined maximum erase voltage, and thereafter the method further includes subjecting said sector to a defect management process comprising:

providing spare cells in said sector;

replacing incompletely erased cells by mapping to available spare cells if the number of incompletely erased cells does not exceed that of the available spare cells; otherwise replacing said sector by mapping to another sector.

4. The method as in claim 2, wherein after the sector fails the verifying of programmed data a second time, the method further includes subjecting said sector to the defect management process, and thereafter, if said sector has not been replaced by another sector, it is subjected to the optimized erase; otherwise, it is subjected to the step of programming and the step of verifying until the sector is verified.

5. The method as in claim 3, wherein the first phase and second phase pulsing steps apply to all sectors in a cluster thereof, and any sectors that are verified in second phase or are mapped out are removed from said cluster.

6. The method as in claim 2, wherein all erased cells of the sample of cells of said sector are programmed prior to the first pulsing step.

7. The method as in claim 3, wherein all erased cells of the sample of cells of said sector are programmed prior to the first pulsing step.

8. The method as in claim 2, further including the step of:

storing the incremented erase voltage after the number of completely erased cells in the sample exceeds said predetermined number of cells but before a next erase voltage increment, said incremented erase voltage being usable to establish a starting erase voltage for a subsequent erase operation of the same sector.

9. The method as in claim 2, wherein said sector is among a group of selected sectors to be subjected to the method.

10. The method as in claim 9, wherein the step of erasing with a pulse of initial erase voltage further comprises:

determining a minimum value of corresponding initial erase voltages among the group of sectors;

setting an erase voltage substantially equal to the minimum value;

applying a pulse of said erase voltage to all sectors in the group whose initial erase voltages are equal to or greater than said erase voltage;

incrementing said erase voltage by a predetermined amount if there remains any sector in the group that has an initial erase voltage that is greater than said erase voltage; and repeating the steps of applying, and incrementing until the erase voltage has exceeded the initial erase voltage of all sectors in the group.

11. The method as in claim 9, wherein the step of erasing with a pulse of initial erase voltage further comprises:

determining a minimum value and a maximum value of corresponding initial erase voltages among the group of sectors;

setting an erase voltage substantially equal to the minimum value;

applying a pulse of said erase voltage to all sectors in the group whose initial erase voltages are equal or less than said erase voltage;

incrementing said erase voltage by a predetermined amount if said erase voltage has not exceeded the maximum value; and repeating the steps of applying, and incrementing until the erase voltage has exceeded the maximum value.

* * * * *